(12) United States Patent
Li et al.

(10) Patent No.: US 12,414,407 B2
(45) Date of Patent: Sep. 9, 2025

(54) LIGHT-EMITTING ELEMENT AND DISPLAY PANEL INCLUDING A LIGHT GUIDE STRUCTURE TO IMPROVE OPTICAL QUALITY

(71) Applicant: PlayNitride Display Co., Ltd., MiaoLi County (TW)

(72) Inventors: Yun-Li Li, MiaoLi County (TW); Tzu-Yang Lin, MiaoLi County (TW); Yen-Chun Tseng, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 1030 days.

(21) Appl. No.: 17/243,496

(22) Filed: Apr. 28, 2021

(65) Prior Publication Data

US 2022/0293819 A1    Sep. 15, 2022

(30) Foreign Application Priority Data

Mar. 12, 2021   (TW) .................................. 110108846

(51) Int. Cl.
*H10H 20/814*    (2025.01)
*H10H 20/82*    (2025.01)
(Continued)

(52) U.S. Cl.
CPC .......... *H10H 20/82* (2025.01); *H10H 20/814* (2025.01); *H10H 20/8312* (2025.01); *H10H 20/841* (2025.01); *H10H 20/852* (2025.01); *H10H 20/855* (2025.01); *H10H 20/856* (2025.01); *H10H 29/142* (2025.01)

(58) Field of Classification Search
None
See application file for complete search history.

(56) References Cited

U.S. PATENT DOCUMENTS

2007/0284567 A1   12/2007   Pokrovskiy et al.
2014/0203318 A1    7/2014   Matsui et al.
(Continued)

FOREIGN PATENT DOCUMENTS

CN    104009131    8/2014
CN    105895775    8/2016
(Continued)

OTHER PUBLICATIONS

"Notice of allowance of China Counterpart Application", issued on Aug. 4, 2023, p. 1-p. 4.
(Continued)

*Primary Examiner* — Christine S. Kim
*Assistant Examiner* — Tyler J Wiegand
(74) *Attorney, Agent, or Firm* — JCIPRNET

(57) ABSTRACT

A light-emitting element including an epitaxial structure and a light guide structure is provided. The epitaxial structure has a first surface and a second surface opposite to each other and includes an active layer. The light guide structure is disposed on the first surface of the epitaxial structure and includes a first light reflection layer and a filter layer covering on an upper surface of the first light reflection layer. The first light reflection layer completely covers the first surface. A display panel is also provided.

20 Claims, 20 Drawing Sheets

(51) Int. Cl.
*H10H 20/831* (2025.01)
*H10H 20/841* (2025.01)
*H10H 20/852* (2025.01)
*H10H 20/855* (2025.01)
*H10H 20/856* (2025.01)
*H10H 29/14* (2025.01)

(56) References Cited

U.S. PATENT DOCUMENTS

| | | | |
|---|---|---|---|
| 2016/0013383 | A1 | 1/2016 | Wu et al. |
| 2019/0058096 | A1 | 2/2019 | Guo et al. |
| 2019/0326473 | A1* | 10/2019 | Choi ................. H10H 20/824 |
| 2021/0005797 | A1* | 1/2021 | Kang ................. H10H 20/018 |
| 2021/0091257 | A1* | 3/2021 | Hwang ............... H01L 25/0753 |
| 2022/0069171 | A1* | 3/2022 | Kuo ................... H01L 25/0753 |

FOREIGN PATENT DOCUMENTS

| | | |
|---|---|---|
| CN | 111146231 | 5/2020 |
| JP | H04252083 | 9/1992 |
| JP | 2001024210 | 1/2001 |
| KR | 20140098521 | 8/2014 |
| TW | 202021154 | 6/2020 |
| TW | 202029534 | 8/2020 |
| WO | 2018174425 | 9/2018 |
| WO | 2020229043 | 11/2020 |

OTHER PUBLICATIONS

"Office Action of Chinese Counterpart Application", issued on Dec. 12, 2022, p. 1-p. 6.
"Office Action of Taiwan Counterpart Application", issued on Oct. 5, 2021, p. 1-p. 11.

* cited by examiner

LIGHT-EMITTING ELEMENT AND DISPLAY PANEL INCLUDING A LIGHT GUIDE STRUCTURE TO IMPROVE OPTICAL QUALITY

CROSS-REFERENCE TO RELATED APPLICATION

This application claims the priority benefit of Taiwan application Ser. No. 110108846, filed on Mar. 12, 2021. The entirety of the above-mentioned patent application is hereby incorporated by reference herein and made a part of this specification.

BACKGROUND

Technical Field

The disclosure relates to a semiconductor device, and particularly relates to a light-emitting element and a display panel.

Description of Related Art

Color presentation of a display panel may directly affect viewer's perception, so that the display panel must have a higher chromaticity specification to achieve a better visual experience. Furthermore, color purity of light emitted by a light-emitting element in the display panel may have a considerable impact on optical quality thereof. For example, when the color purity of the emitted light is higher, the display panel may have better optical quality, so that how to improve the color purity of the light emitted by the light-emitting element to make the display panel to have better optical quality is a very important issue in the field.

SUMMARY

The disclosure is directed to a light-emitting element and a display panel, which are adapted to improve color purity of light emitted by the light-emitting element, so that the display panel has better optical quality.

The disclosure provides a light-emitting element including an epitaxial structure and a light guide structure. The epitaxial structure has a first surface and a second surface opposite to each other and includes an active layer. The light guide structure is disposed on the first surface of the epitaxial structure and includes a sequentially stacked first light reflection layer and a filter layer covering an upper surface of the first light reflection layer. The first light reflection layer completely covers the first surface.

In an embodiment of the disclosure, the filter layer partially covers the upper surface of the first light reflection layer.

In an embodiment of the disclosure, the first light reflection layer includes a first region covered by the filter layer and a second region exposed outside the filter layer, and a ratio of an area of the first region to an area of the upper surface is greater than or equal to 20%.

In an embodiment of the disclosure, the light-emitting element further includes at least one electrode electrically connected to the epitaxial structure, and the at least one electrode is adjacent to the filter layer and disposed on the upper surface.

In an embodiment of the disclosure, the filter layer completely covers the upper surface of the first light reflection layer.

In an embodiment of the disclosure, the light-emitting element further includes a second light reflection layer, and the second light reflection layer covers the second surface.

In an embodiment of the disclosure, the epitaxial structure further has a side surface connecting the first surface and the second surface, and the second light reflection layer further covers the side surface.

In an embodiment of the disclosure, the first light reflection layer extends beyond the side surface of the epitaxial structure, and the second light reflection layer is connected to the first light reflection layer.

In an embodiment of the disclosure, the light-emitting element further includes a first protective layer, and the light guide structure is located between the first protective layer and the epitaxial structure, or the first protective layer is located between the first light reflection layer and the epitaxial structure.

In an embodiment of the disclosure, the light-emitting element further includes a second protective layer, and the second protective layer is disposed at both sides of the filter layer and covers the first light reflection layer.

In an embodiment of the disclosure, the light-emitting element further includes a plurality of electrodes electrically connected to the epitaxial structure. The plurality of electrodes are disposed on the second surface of the epitaxial structure; or the plurality of electrodes are respectively disposed on the first surface and the second surface of the epitaxial structure.

In an embodiment of the disclosure, a thickness of the filter layer is positively correlated with an equivalent refractivity of the light guide structure.

In an embodiment of the disclosure, the first light reflection layer is doped with a P-type material or an N-type material.

In an embodiment of the disclosure, the first light reflection layer and the filter layer include an aluminum material, and aluminum content of the first light reflection layer is less than aluminum content of the filter layer.

The disclosure provides a display panel including a substrate and a plurality of light-emitting elements. The light-emitting elements are arranged on the substrate. The light-emitting elements have different color light and are electrically connected to the substrate. Each of the light-emitting elements includes an epitaxial structure and a light guide structure. The epitaxial structure has a first surface and a second surface opposite to each other and includes an active layer. The light guide structure is disposed on the first surface of the epitaxial structure and includes a first light reflection layer and a filter layer covering an upper surface of the first light reflection layer. The first light reflection layer completely covers the first surface.

In an embodiment of the disclosure, an area of an orthographic projection of the filter layer of each of the light-emitting elements on the substrate is less than or equal to an area of an orthographic projection of the corresponding epitaxial structure on the substrate.

In an embodiment of the disclosure, the first light reflection layers of the light-emitting elements are connected to each other.

In an embodiment of the disclosure, the protective layer is located between the first light reflection layers and the epitaxial structures of the light-emitting elements.

In an embodiment of the disclosure, a gap exists between any two adjacent filter layers, and the first light reflection layers are exposed to the outside by the gap.

In an embodiment of the disclosure, the light-emitting elements respectively have first color light, second color light, and third color light. Each of the light-emitting elements includes a first filter layer allowing the first color light to pass through, a second filter layer allowing the second color light to pass through, and a third filter layer allowing the third color light to pass through. The first filter layer, the second filter layer and the third filter layer are sequentially stacked on the first light reflection layer.

In an embodiment of the disclosure, the epitaxial structure further has a side surface connecting the first surface and the second surface. Each of the light-emitting elements further includes a second light reflection layer, and the second light reflection layer covers the second surface and the side surface.

Based on the above description, in the light-emitting element of the disclosure, through combination of the first light reflection layer and the filter layer, only light of a specific wavelength may be transmitted out of the light guide structure. In this way, the wavelength (color) of the emitted light may be controlled within a small range, thereby improving the color purity of the light emitted by the light-emitting elements, so that the display panel including the light-emitting elements has better optical quality.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Detailed features and advantages of the disclosure are described in detail in following embodiments, and the content thereof is sufficient to enable anyone familiar with the related art to understand the technical content of the disclosure and implement the same accordingly, and according to the content disclosed in this specification, a scope of patent application and the drawings, anyone familiar with the related art may easily understand the purpose and advantages of the disclosure. The following examples further illustrate the viewpoints of the disclosure in detail, but the scope of the disclosure is not limited by any viewpoint.

Figure 1:
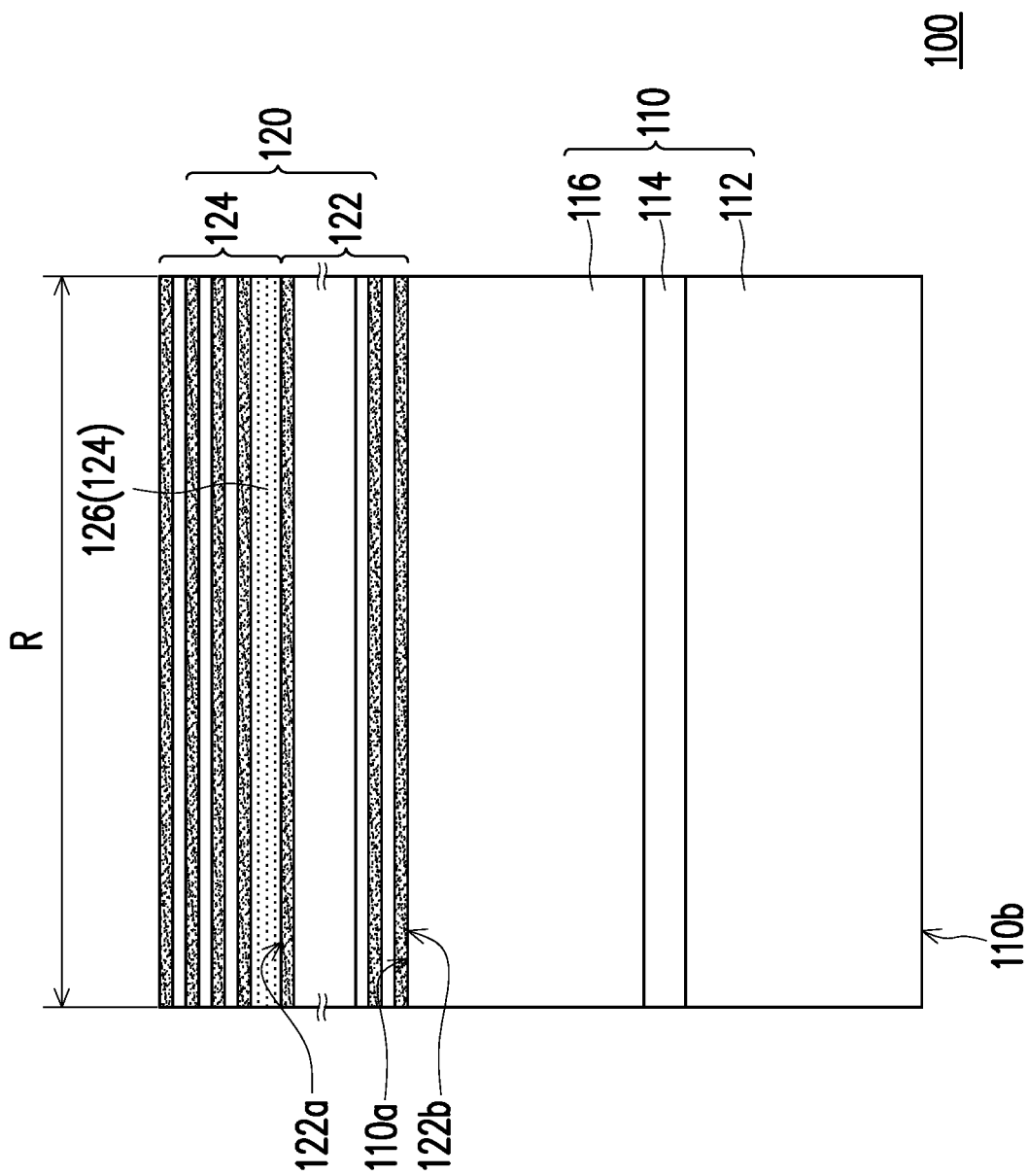
FIG. 1-FIG. 12 are schematic partial cross-sectional views of light-emitting elements according to some embodiments of the disclosure.

FIG. 1-FIG. 12 are schematic partial cross-sectional views of light-emitting elements according to some embodiments of the disclosure. Referring to FIG. 1, in the embodiment, a light-emitting element 100 includes an epitaxial structure 110 and a light guide structure 120, wherein the epitaxial structure 110 has a first surface 110a and a second surface 110b opposite to each other, and the light guide structure 120 is disposed on the first surface 110a of the epitaxial structure 110. Furthermore, the epitaxial structure 110 may include a first-type semiconductor layer 112, an active layer 114, and a second-type semiconductor layer 116 stacked in sequence, and the light guide structure 120 includes a first light reflection layer 122 and a filter layer 124.

In some embodiments, the first-type semiconductor layer 112 of the epitaxial structure 110 is, for example, a P-type semiconductor layer, such as P-GaN, and the active layer 114 is, for example, a multiple quantum well (MQW) structure, while the second-type semiconductor layer 116 is, for example, an N-type semiconductor layer, such as N—GaN, but the disclosure is not limited thereto, and may be adjusted according to actual design requirements.

In the embodiment, the first light reflection layer 122 of the light guide structure 120 completely covers the first surface 110a, and the filter layer 124 covers an upper surface 122a of the first light reflection layer 122. Therefore, through the combination of the first light reflection layer 122 and the filter layer 124, the first light reflection layer 122 may form a forbidden band, and the filter layer 124 may be used to change an equivalent refractivity of the covered first light reflection layer 122, so as to form a constructive interference section corresponding to a specific transmission spectrum in the forbidden band to only allow light with a wavelength within such section to pass through. Therefore, by covering the upper surface 122a of the first light reflection layer 122 with the filter layer 124, when the light projected to the first light reflection layer 122, the light is shielded by the forbidden band. If a wavelength of the light is matched with the equivalent refractivity of the filter layer 124 (and the first light reflection layer 122), it represents that the light is constructively interfered with an incident interface, so that only light of a specific wavelength may be transmitted through the light guide structure 120. In this way, the wavelength (color) of the emitted light may be controlled within a small range, thereby improving the color purity of the emitted light of the light-emitting element 100. In here, the light of the light-emitting element 100 may be emitted from the active layer 114 toward the light guide structure 120, and the upper surface 122a of the first light reflection layer 122 may be opposite to a lower surface 122b, wherein the lower surface 122b directly contacts the first surface 110a of the epitaxial structure 110.

In some embodiments, the first light reflection layer 122 and the filter layer 124 may be a multilayer structure disposed on the epitaxial structure 110. For example, the filter layer 124 may include one or more layers of refractivity matching layer 126, and changes in configuration of the material of each layer of the filter layer 124 and the refractivity matching layer 126 (such as but not limited to changes in material, thickness, sequence, number, etc.) may determine a wavelength of light that is allowed to pass through the filter layer 124. From an optical perspective, an overlapping portion of the first light reflection layer 122 and the filter layer 124 in a stacking direction of the epitaxial structure 110 may be regarded as a band pass filter (BPF), and a portion of the first light reflection layer 122 that is not overlapped with the filter layer 124 in the stacking direction of the epitaxial structure 110 may be regarded as a distributed Bragg reflector (DBR) (which is not shown in the embodiment), but the disclosure is not limited thereto.

In some embodiments, the thickness, material, and arrangement of each layer in the multilayer structure of the first light reflection layer 122 and the filter layer 124 may affect an overall equivalent refractivity and a transmissible wavelength. For example, the thicker a single layer in the multilayer structure of the first light reflection layer 122 and the filter layer 124 is and the denser the multilayer arrangement is (the smaller a distance between the layers is), the larger the overall equivalent refractivity is, and the larger the transmissible wavelength is, but the disclosure is not limited thereto.

In some embodiments, the material of the first light reflection layer 122, the filter layer 124 and the refractivity matching layer 126 include $SiO_2$, $TiO_2$, $Ta_2O_5$, $Ta_xO_y$, $MgF_2$, $SiN_x$, SiON or a combination thereof, but the disclosure is not limited thereto.

In some embodiments, the first light reflection layer 122 and the filter layer 124 are doped with a P-type material or an N-type material, the first light reflection layer 122 and the filter layer 124 include aluminum materials, and aluminum content of the first light reflection layer 122 is less than aluminum content of the filter layer 124. For example, the material of the first light reflection layer 122 and the material of the filter layer 124 include $Al_xGa_{1-x}N$, $Al_xGa_{1-x}InN$, $Al_xGa_{1-x}InP$, $Al_xGa_{1-x}As$, or a combination thereof. The smaller the value of x is, the lower the aluminum content is, and the higher the refractivity is. Therefore, the aluminum content of the first light reflection layer 122 may be less than the aluminum content of the filter layer 124, so that the refractivity of the first light reflection layer 122 may be greater than the refractivity of the filter layer 124, but the disclosure is not limited thereto.

In some embodiments, the material of the first light reflection layer 122 and the material of the filter layer 124 may be the same, but the disclosure is not limited thereto, and the material of the first light reflection layer 122 and the material of the filter layer 124 may also be different.

In some embodiments, the first light reflection layer 122 includes a region R covered by the filter layer 124, wherein a ratio of an area of the region R to an area of the upper surface 122a is greater than or equal to 20%, so as to reduce production difficulty of the film layers. For example, the filter layer 124 of the embodiment may completely cover the upper surface 122a of the first light reflection layer 122, i.e., the ratio of the area of the region R to the area of the upper surface 122a is 100%, but the disclosure is not limited thereto, and other embodiments may have different coverage patterns.

In some embodiments, the refractivity matching layer 126 covers and contacts the upper surface 122a of the first light reflection layer 122, so that the equivalent refractivity of the light guide structure 120 may be changed by adjusting the refractivity matching layer 126 in the filter layer 124, but the disclosure is not limited thereto.

In some embodiments, the thickness of the refractivity matching layer 126 is positively related with the equivalent refractivity of the light guide structure 120, and an expression thereof may be $d=\lambda/2n$, wherein d is the thickness, $\lambda$ is the wavelength, and n is the refractivity. For example, when the thickness of the refractivity matching layer 126 becomes thicker, the equivalent refractivity becomes higher and a critical refraction angle becomes smaller, so that a light shape is narrowed and a light output range becomes smaller, and vice versa. When the thickness of the refractivity matching layer 126 becomes thinner, the equivalent refractivity becomes lower and the critical refraction angle becomes larger, so that the light shape is broadened, and the light output range becomes larger. Therefore, by adjusting the thickness of the refractivity matching layer 126, a total internal reflection angle and the transmission angle of the filter layer 126 are controlled within a required range, but the disclosure is not limited thereto.

Accordingly, in the light-emitting element 100 of the embodiment, the equivalent refractivity of the overall structure is adjusted through the design of the first light reflection layer 122 and the filter layer 124 in the light guide structure 120, so that the light guide structure 120 only allows photons of a specific wavelength to pass through in each wavelength range. Namely, only light of a specific wavelength may be transmitted out of the light guide structure 120. In this way, the wavelength (color) of the emitted light may be controlled within a small range, which improves the color purity of the light emitted by the light-emitting element 100.

It should be noted that reference numbers of the components and a part of contents of the aforementioned embodiment are also used in the following embodiment, wherein the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
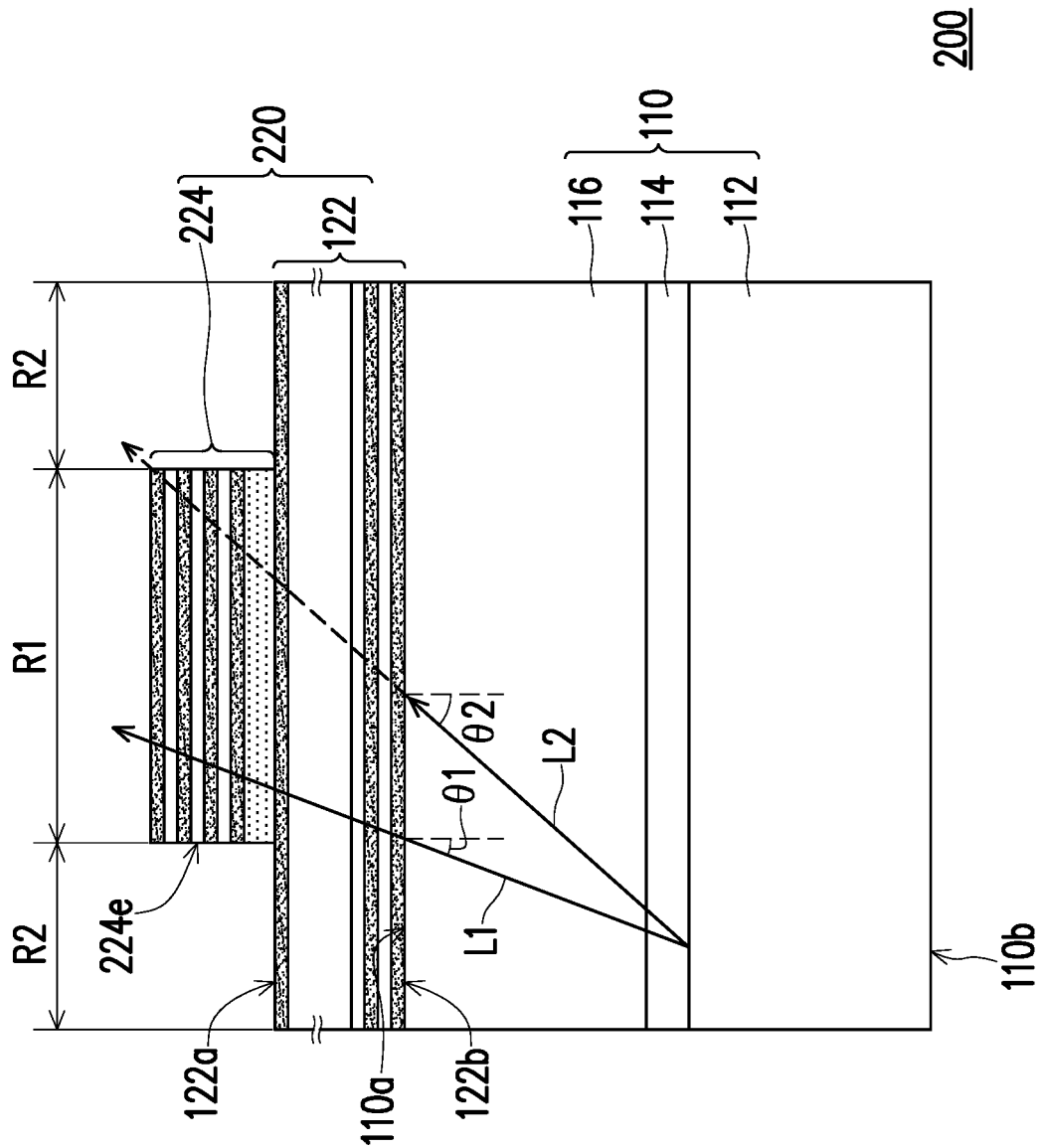

Referring to FIG. 2, compared with the light-emitting element 100, a filter layer 224 of a light guide structure 220 of a light-emitting element 200 of the embodiment partially covers the upper surface 122a of the first light reflection layer 122. In other words, the filter layer 224 may be retracted within the first light reflection layer 122, so that the light shape may be controlled within a desired light output range, and probability of light divergence may be reduced. For example, an angle at which light L1 enters the first light reflection layer 122 is 01, and a light output point thereof is located between side edges 224e of the filter layer 224, so that the light L1 may be transmitted out, and an angle at which light L2 enters the first light reflection layer 122 is 02, and a light output point thereof is coincided with the side edge 224e of the filter layer 224. Namely, when the angle of the light incident to the first light reflection layer 122 is greater than 02, the light is subjected to a total internal reflection and cannot be transmitted out, but the disclosure is not limited thereto.

In the embodiment, the first light reflection layer 122 may include a region R1 covered by the filter layer 224 and a second region R2 exposed outside the filter layer 224, wherein the first region R1 is sandwiched between two adjacent first regions R1. Furthermore, a ratio of an area of the first region R1 to an area of the upper surface 122a may be greater than or equal to 20% and less than 100%, but the disclosure is not limited thereto.

Figure 3:
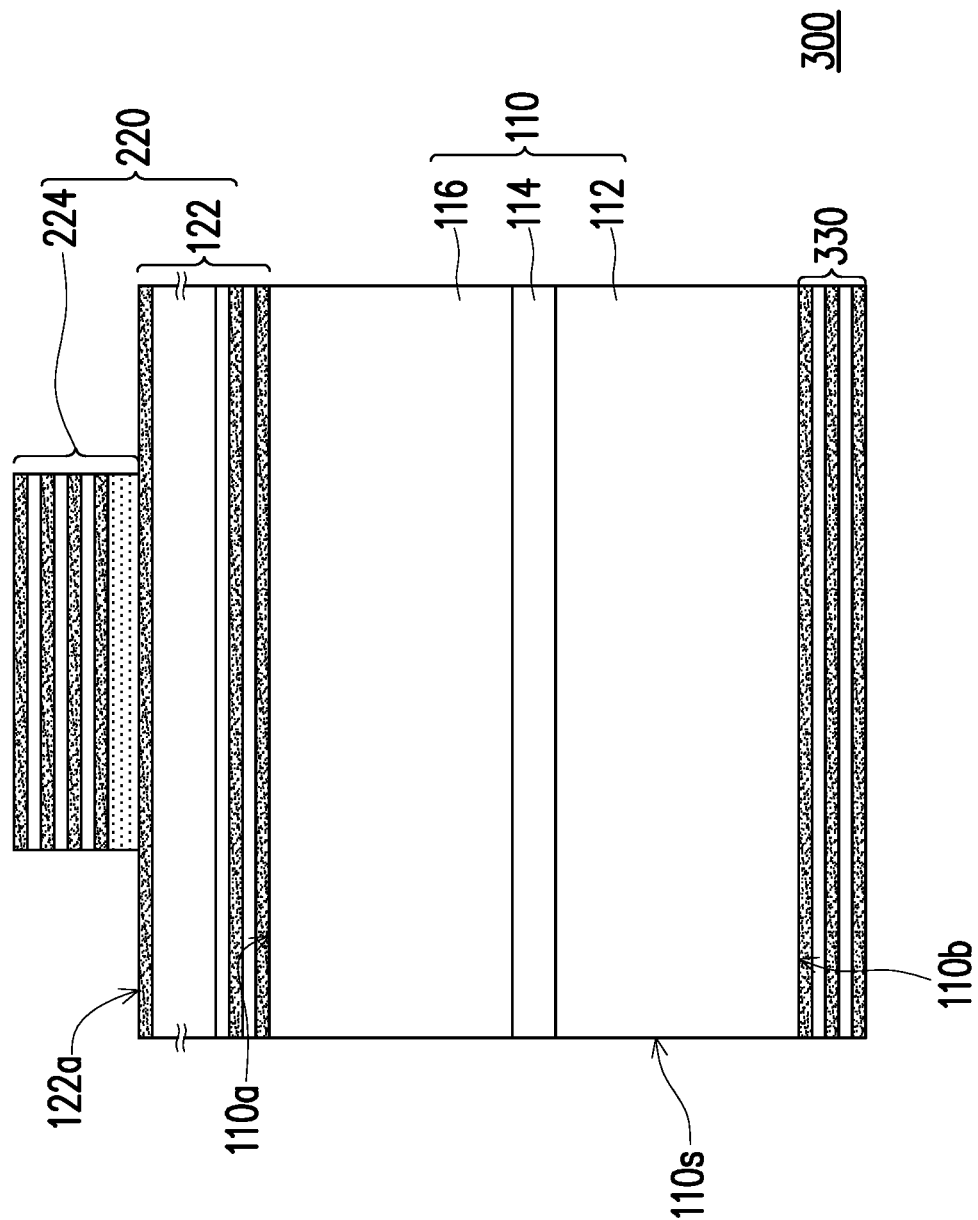

Referring to FIG. 3, compared with the light-emitting element 200, a light-emitting element 300 of the embodiment further includes a second light reflection layer 330 covering the second surface 110b, wherein the second light reflection layer 330 may have a function of a distributed Bragg reflector, through the design of the distributed Bragg reflector, the light emitted downward from the active layer 114 may be reflected back for recycling, and the recycled light may be emitted from the top to increase a light output of the light-emitting element 300. The second light reflection layer 330 may be similar to the first light reflection layer 122, which is omitted.

In the embodiment, the second light reflection layer 330 may completely cover the second surface 110b of the epitaxial structure 110 and does not extend beyond a side surface 110s of the epitaxial structure 110, wherein the side surface 110s is a surface of the epitaxial structure 110 connecting the first surface 110a and the second surface 110b, but the disclosure is not limited thereto. In some embodiments, the second light reflection layer may be retracted within the side surface 110s of the epitaxial structure 110, or the second light reflection layer may extend beyond the side surface 110s of the epitaxial structure 110.

Figure 4:
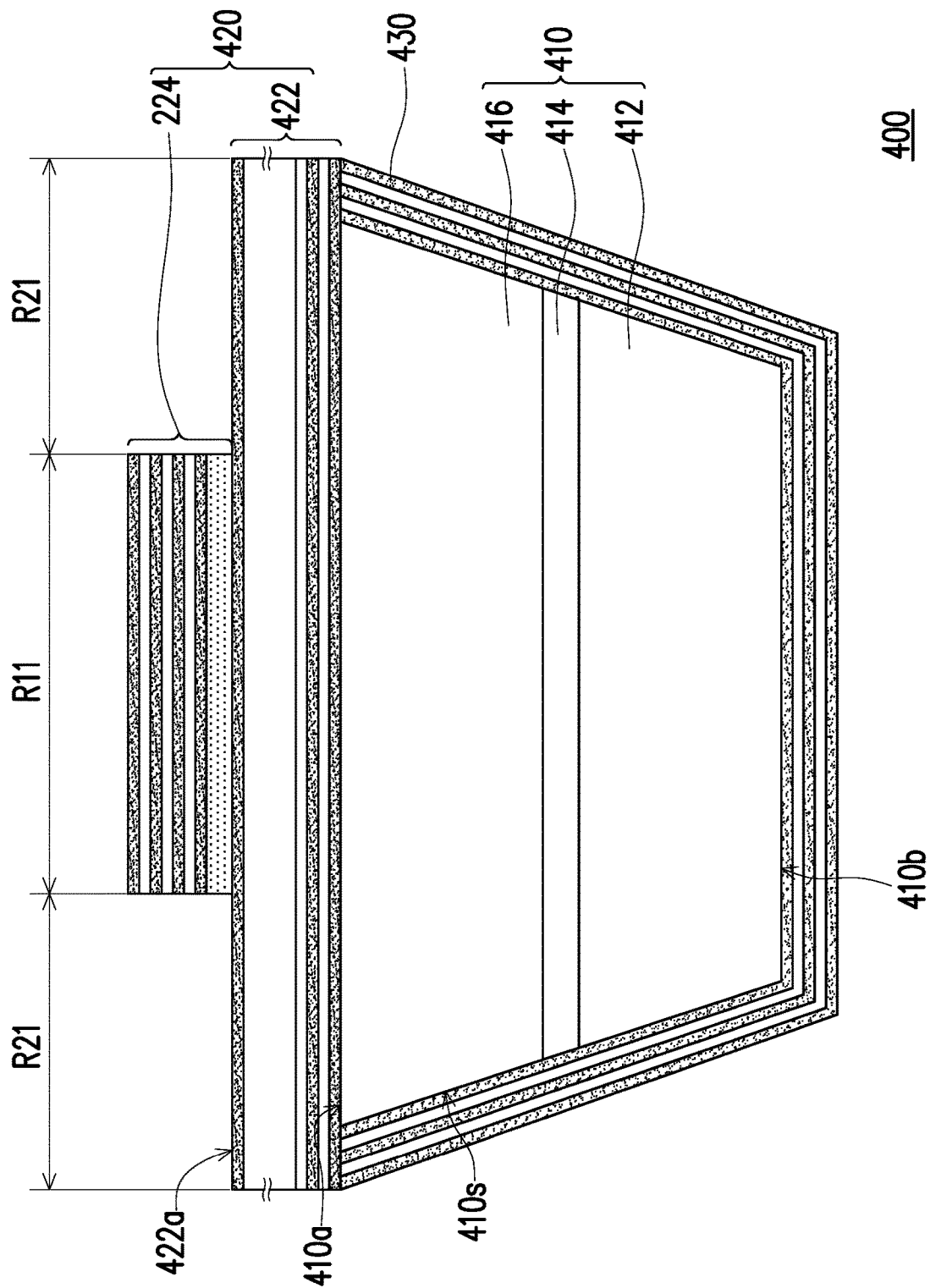

Referring to FIG. 4, compared with the light-emitting element 300, a second light reflection layer 430 of a light-emitting element 400 of the embodiment further covers a side surface 410s of an epitaxial structure 410 to protect the epitaxial structure 410, so that a part of light may be reflected in the epitaxial structure 410 and then emitted out, and when the light-emitting elements are subsequently applied to the display panel in an array manner, a phenomenon of lateral light mixing may be prevented, wherein the side surface 410s is a surface of the epitaxial structure 410 connecting a first surface 410a and a second surface 410b. In here, a cross-sectional profile of the epitaxial structure 410 may be a trapezoidal profile. Therefore, a side surface of a first-type semiconductor layer 412, a side surface of an active layer 414, and a side surface of a second-type semiconductor layer 416 in the epitaxial structure 410 may be obliquely extended and connected, but the disclosure is not limited thereto. In an embodiment that is not illustrated, a cross-sectional profile of an epitaxial structure may also be a rectangular profile as shown in FIG. 1 to FIG. 3. It should be noted that the cross-sectional profiles of the epitaxial structures in various embodiments of the disclosure may all be trapezoidal profiles or rectangular profiles.

In the embodiment, a first light reflection layer 422 of a light guide structure 420 extends beyond the side surface 410s of the epitaxial structure 410, and the second light reflection layer 430 is connected to the first light reflection layer 422 so that the first light reflection layer 422 and the second light reflection layer 430 surround the epitaxial structure 410, but the disclosure is not limited thereto.

In the embodiment, the first light reflection layer 422 may include a first region R11 covered by the filter layer 224 and a second region R21 exposed outside the filter layer 224, wherein the filter layer 224 may partially cover an upper surface 422a of the first light reflection layer 422. In other words, a ratio of an area of the first region R11 to an area of the upper surface 422a is less than 100%, but the disclosure is not limited thereto.

Figure 5:
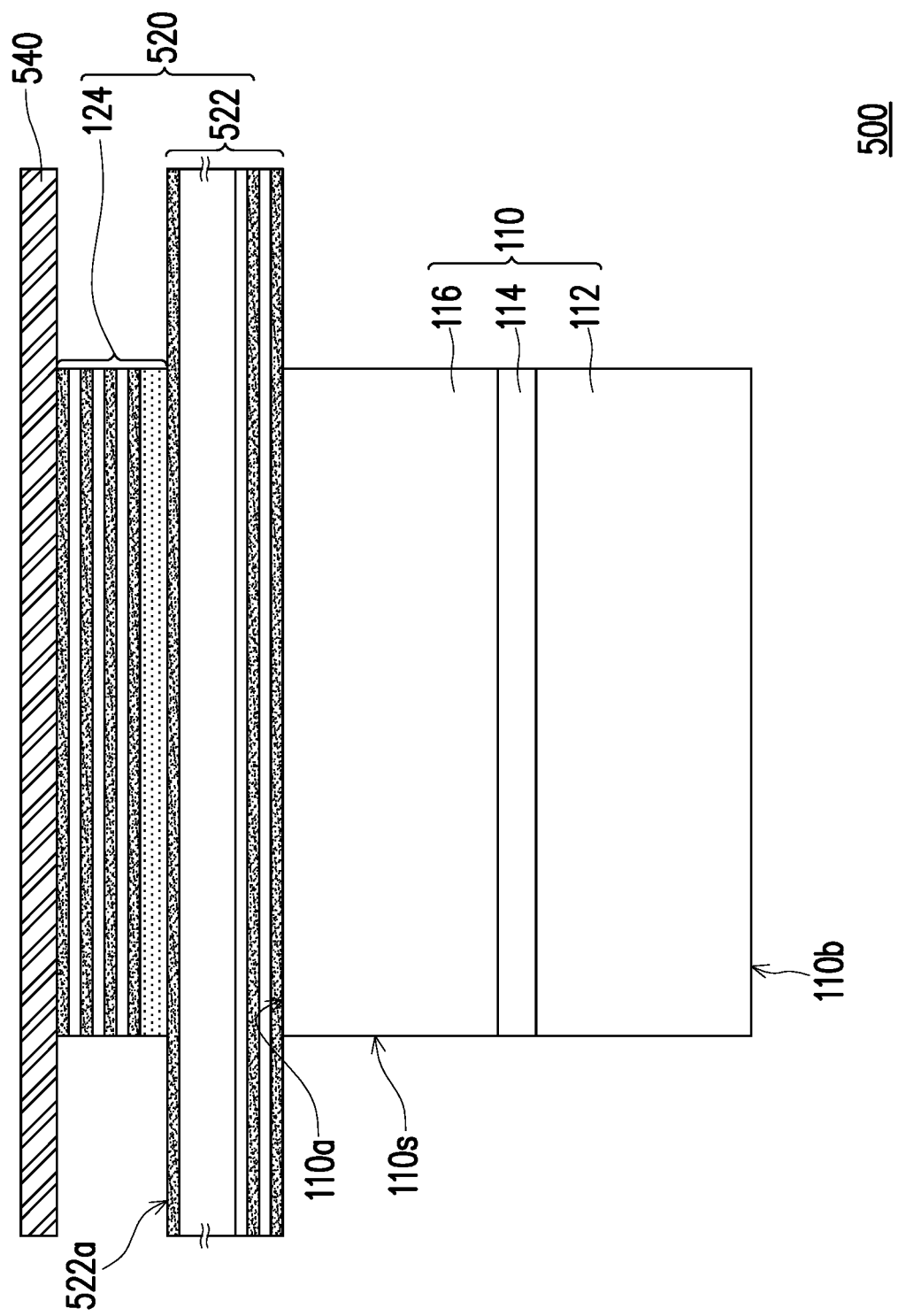

Referring to FIG. 5, compared to the light-emitting element 100, a first light reflection layer 522 of a light guide structure 520 of a light-emitting element 500 of the embodiment extends beyond the side surface 110s of the epitaxial structure 110. In other words, the filter layer 124 may partially cover an upper surface 522a of the first light reflection layer 522. In addition, the light-emitting element 500 may further include a first protective layer 540 disposed on the light guide structure 520, wherein the light guide structure 520 may be located between the first protective layer 540 and the epitaxial structure 110, but the disclosure is not limited thereto. In other embodiments, the first protective layer may have other configurations. A material of the first protective layer 540 may include resin or glass.

In some embodiments, the light guide structure 520 is pre-formed on the first protective layer 540, and then the light guide structure 520 and the first protective layer 540 are soft-bonded to the epitaxial structure 110 to reduce a chance of damaging the light-emitting element caused by a stress formed when the light guide structure 520 is formed on the epitaxial structure 110, wherein the soft bonding is performed by using low-refractive light-transmitting media such as epoxy resin, air (or vacuum), but the disclosure is not limited thereto.

In some embodiments, the light guide structure 520 is first formed on the epitaxial structure 110, and then the first protective layer 540 is bonded to the light guide structure 520, but the disclosure is not limited thereto.

Figure 6:
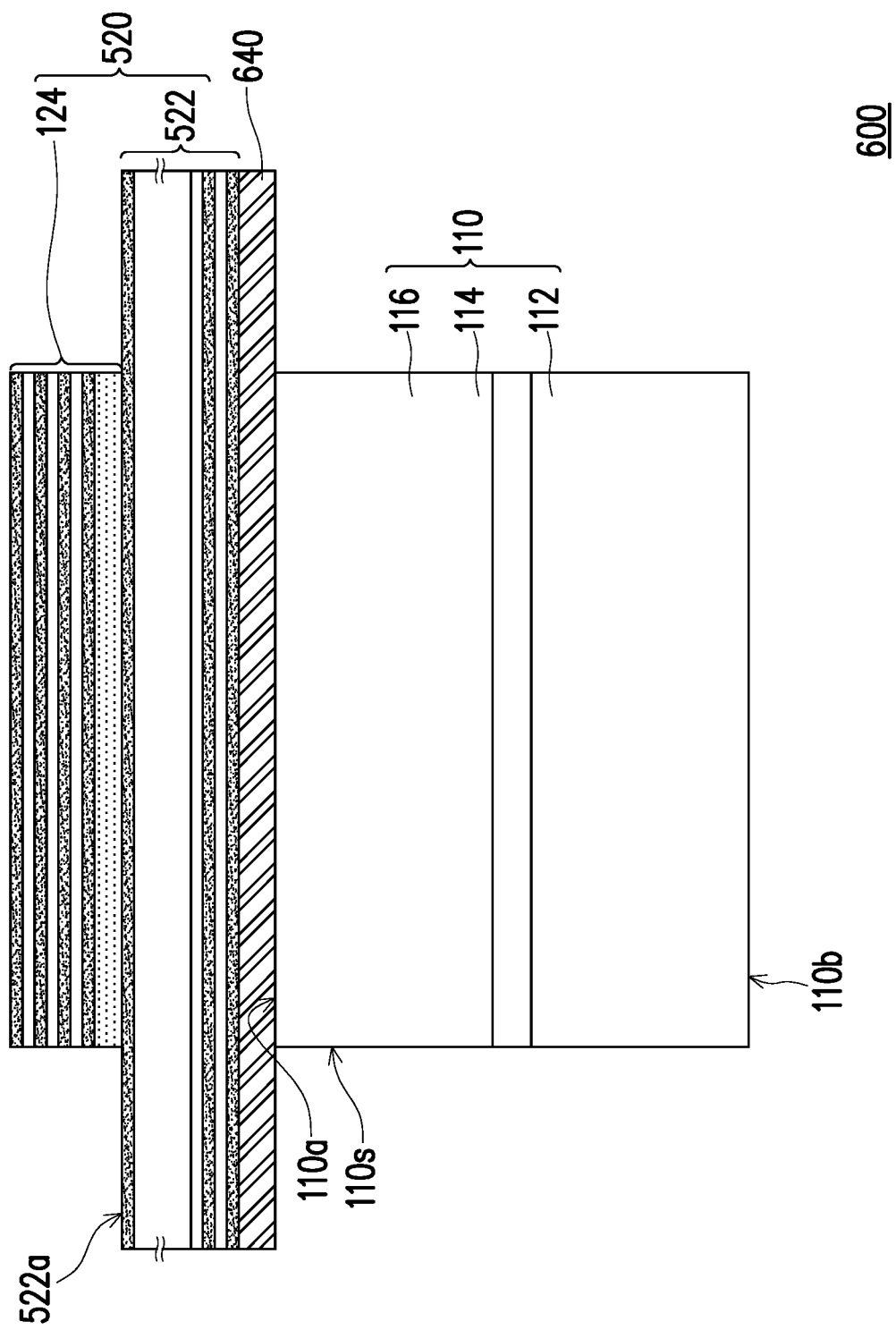

Referring to FIG. 6, compared to the light-emitting element 500, a first protective layer 640 of a light-emitting element 600 of the embodiment is located between the first light reflection layer 522 and the epitaxial structure 110. In other words, the first protective layer 640 may directly contact the second-type semiconductor layer 116 of the epitaxial structure 110, but the disclosure is not limited thereto.

In some embodiments, similar to the first protective layer 540, the light guide structure 520 may be pre-formed on the first protective layer 640, and then the light guide structure 520 and the first protective layer 640 are soft-bonded to the epitaxial structure 110 to reduce the chance of damaging the light-emitting element caused by a stress formed when the light guide structure 520 is formed on the epitaxial structure 110, but the disclosure is not limited thereto.

Figure 7:
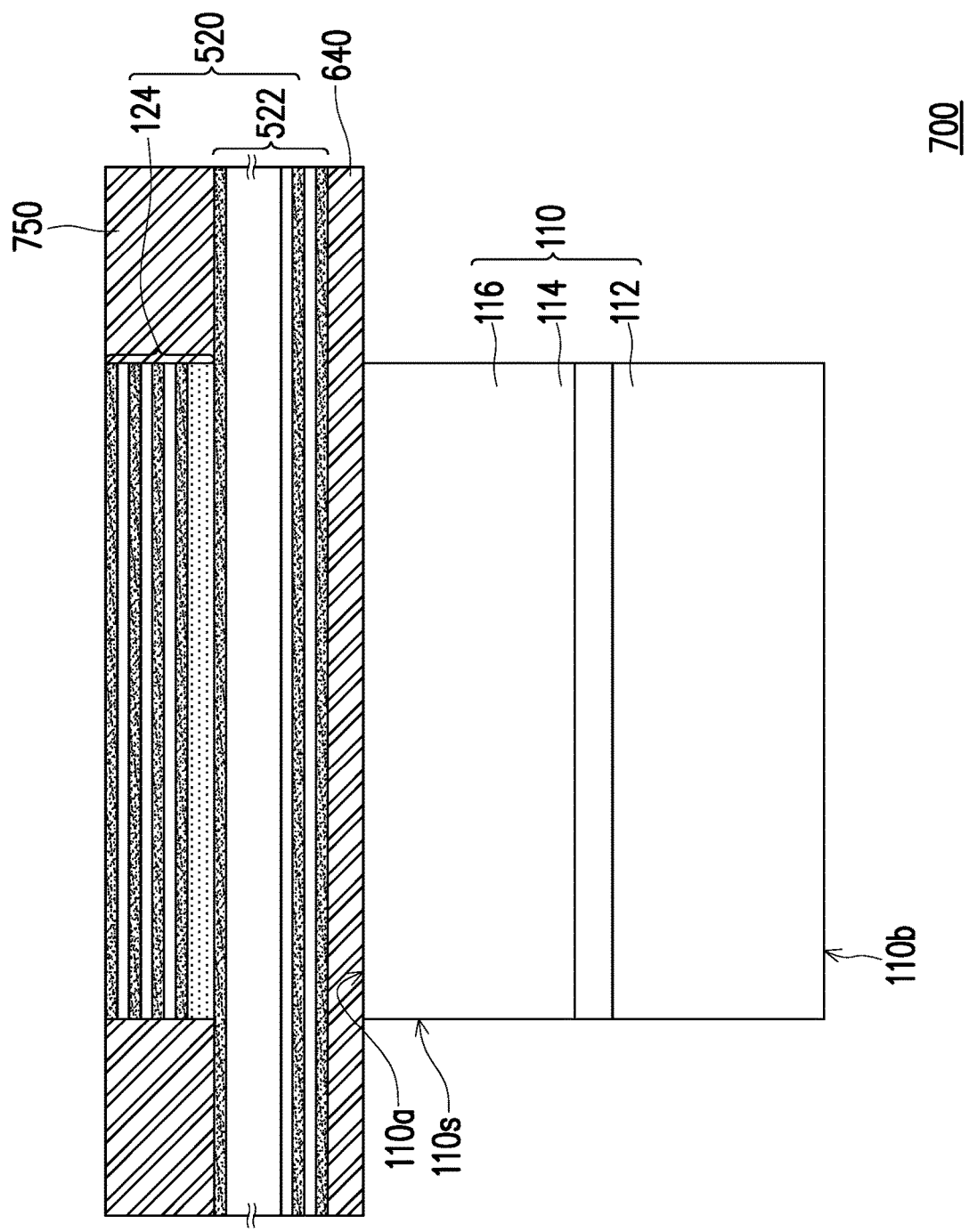

Referring to FIG. 7, compared to the light-emitting element 600, a light-emitting element 700 of the embodiment further includes a second protective layer 750. The second protective layer 750 is disposed at both sides of the filter layer 124 and covers the first light reflection layer 522 to further enhance protection on the light-emitting element 700, but the disclosure is not limited thereto. A material of the second protective layer 750 may include resin or glass.

In some embodiments, the second protective layer 750 surrounds the filter layer 124, but the disclosure is not limited thereto.

Figure 8:
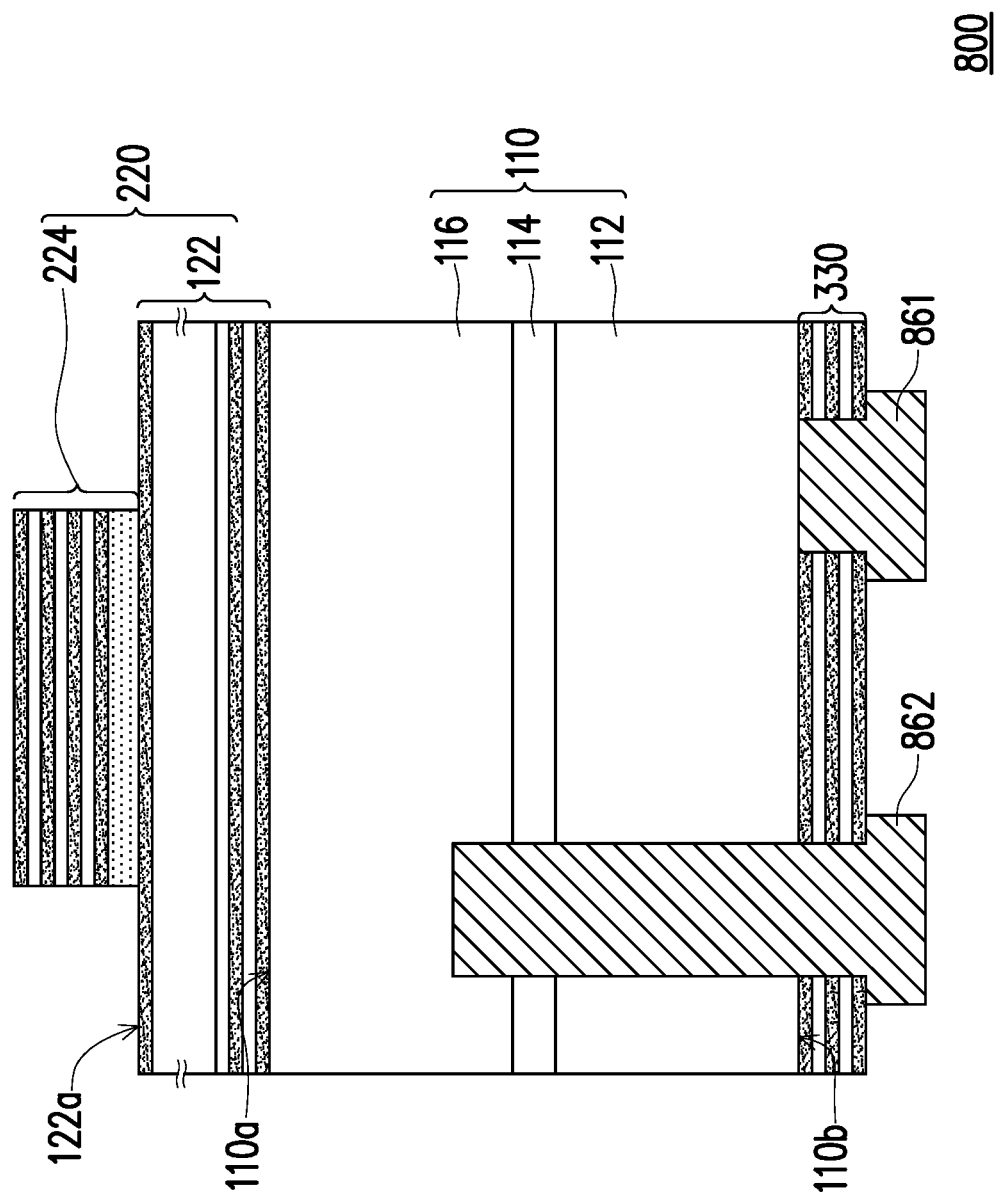

Referring to FIG. 8, compared to the light-emitting element 200, a light-emitting element 800 of the embodiment further includes a plurality of electrodes (such as a first electrode 861 and a second electrode 862 in FIG. 8), wherein the first electrode 861 and the second electrode 862 are disposed on the side of the second surface 110b of the epitaxial structure 110, and are electrically connected to the epitaxial structure 110. In other words, the first electrode 861 and the second electrode 862 may be horizontally arranged on the epitaxial structure 110.

In some embodiments, the first electrode 861 is a first-type electrode and is electrically connected to the first-type semiconductor layer 112, and the second electrode 862 is a second-type electrode and is electrically connected to the second-type semiconductor layer 116, but the disclosure is not limited thereto. A material of the first electrode 861 and the second electrode 862 is, for example, metal, but the disclosure is not limited thereto.

In an embodiment that is not shown, the first electrode 861 and the second electrode 862 are disposed on the side of the first surface 110a of the epitaxial structure 110, wherein the first electrode 861 may penetrate through all of the first light reflection layer 122, the second-type semiconductor layer 116, and the active layer 114 to be in contact with and electrically connected to the first-type semiconductor layer 112. The second electrode 862 is in contact with and electrically connected to the second-type semiconductor layer 116, but the disclosure is not limited thereto.

Figure 9:
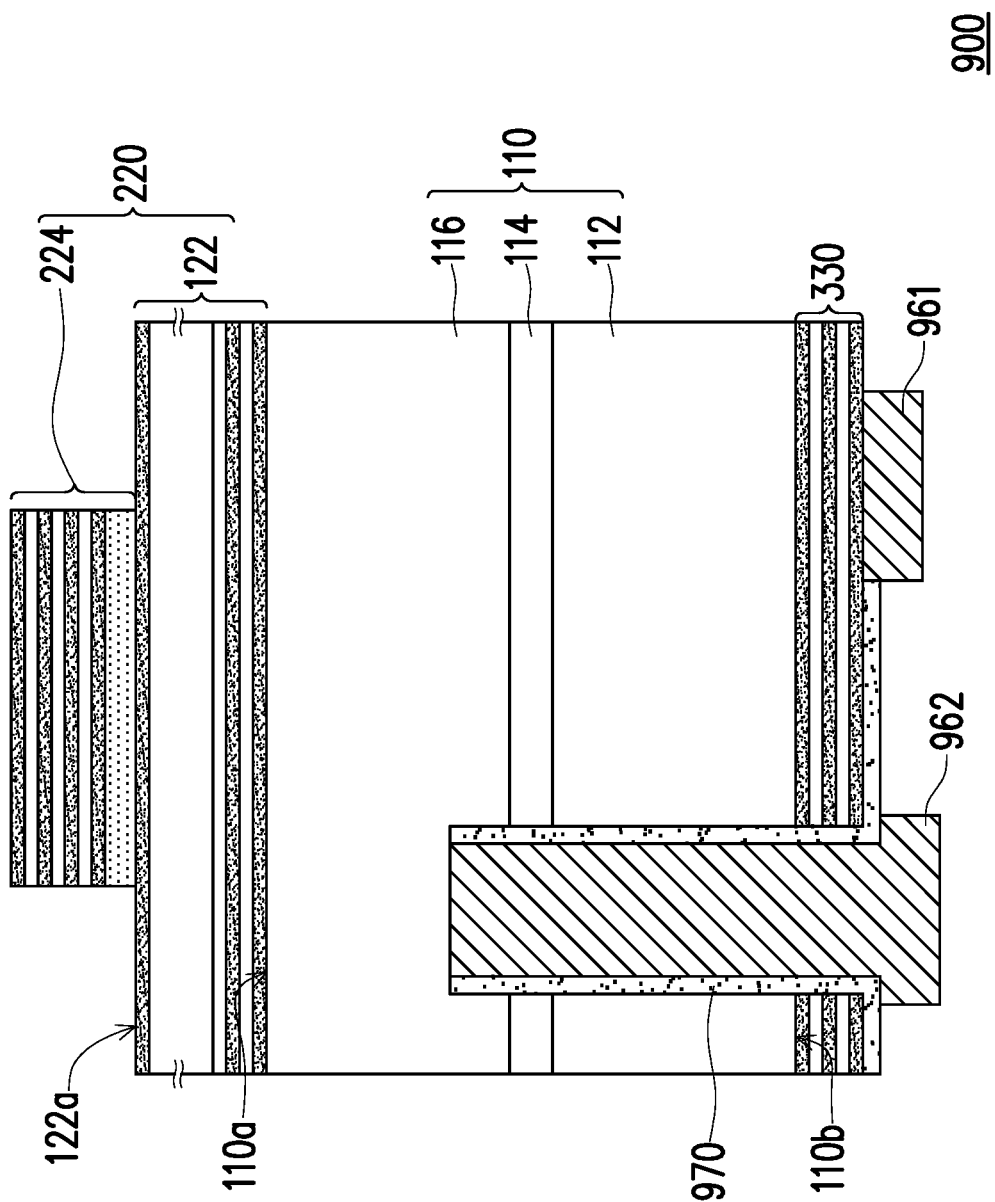

Referring to FIG. 9, compared to the light-emitting element 800, the second light reflection layer 330 of a light-emitting element 900 of the embodiment is doped with a P-type material or an N-type material, so that the first electrode 961 and the second electrode 962 may directly make ohmic contact with the second light reflection layer 330. In addition, the light-emitting element 900 further includes a passivation layer 970 to reduce a chance of current leakage between the first electrode 961 and the second electrode 962, but the disclosure is not limited thereto.

Figure 10:
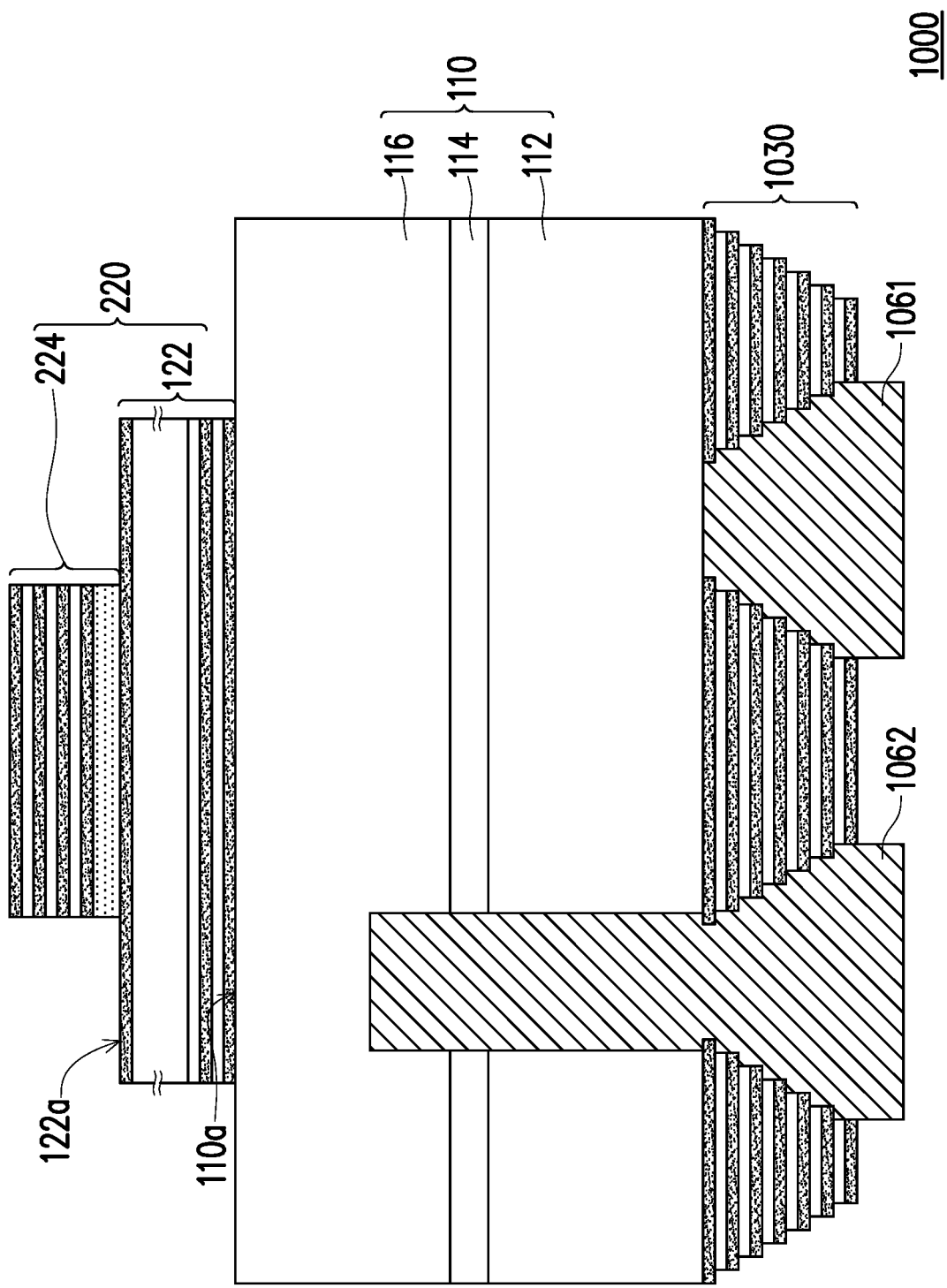

Referring to FIG. 10, compared to the light-emitting element 900, a light-emitting element 1000 of the embodiment further includes a second light reflection layer 1030 in a stair-step shape, and a first electrode 1061 and a second electrode 1062 may also have a stair-step shape corresponding to the second light reflection layer 1030, but the disclosure is not limited thereto.

Figure 11:
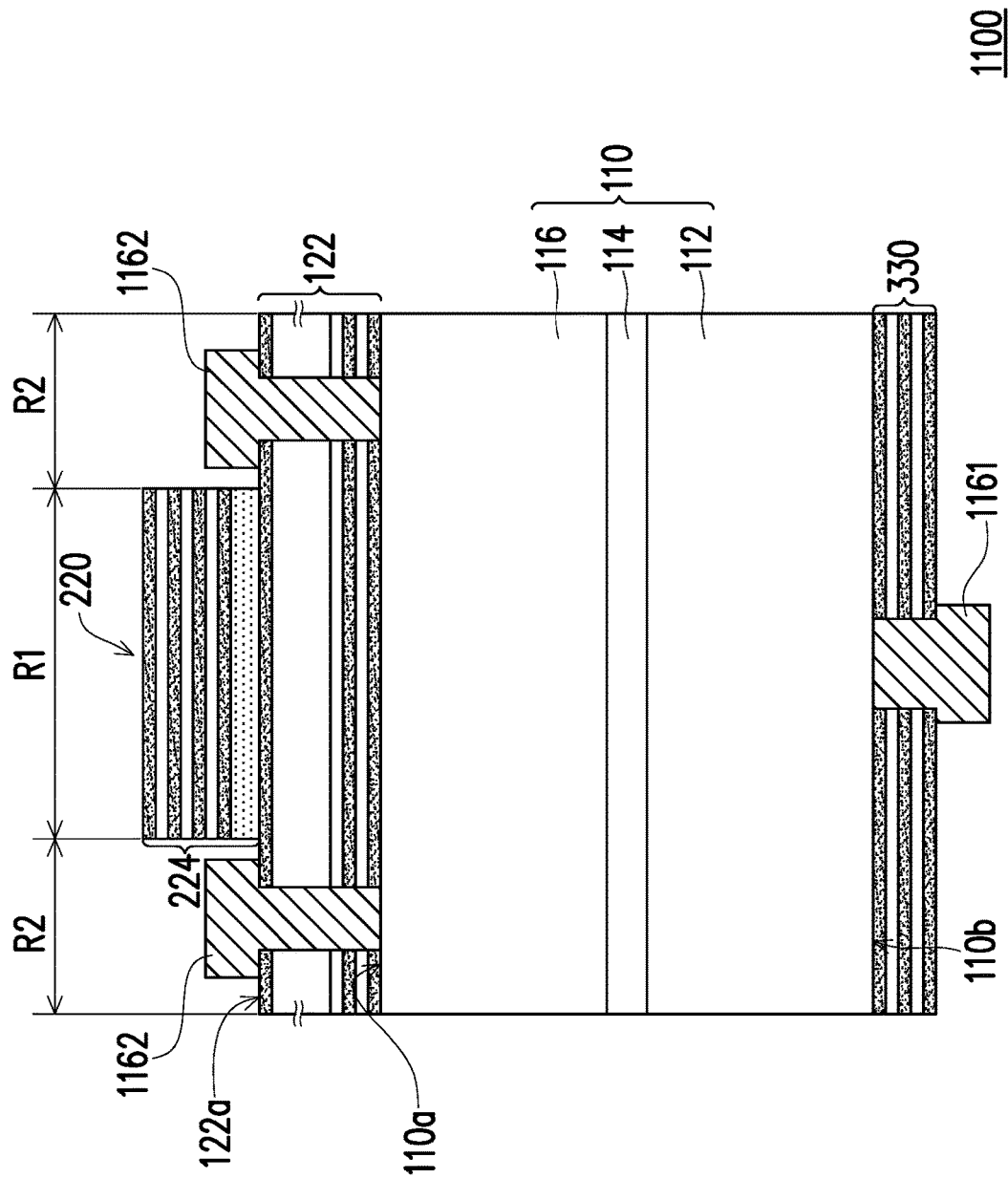

Referring to FIG. 11, compared to the light-emitting element 1000, a plurality of electrodes (a first electrode 1161 and two second electrodes 1162 in FIG. 11) of a light-emitting element 1100 of the embodiment are respectively disposed on the first surface 110a and the second surface 110b of the epitaxial structure 110, and are electrically connected to the epitaxial structure 110. In other words, the first electrode 1161 and the two second electrodes 1162 are vertically arranged on the epitaxial structure 110. Furthermore, in the embodiment, the two second electrodes 1162 are adjacent to the filter layer 224 and are disposed on the upper surface 122a. In other words, the two second electrodes 1162 may be disposed on the second region R2 of the light guide structure 220 exposed outside the filter layer 224, i.e., the second electrodes 1162 are arranged in a non-light-emitting region on both sides of the light guide structure 220, so that there is no need to sacrifice a light-emitting area.

In some embodiments, the first electrode 1161 is a first-type electrode and is electrically connected to the first-type semiconductor layer 112, and the two second electrodes 1162 are second-type electrodes and are electrically connected to the second-type semiconductor layer 116. A material of the first electrode 1161 and the second electrodes 1162 is, for example, metal, but the disclosure is not limited thereto.

In some embodiments, the two second electrodes 1162 are in direct contact with the first light reflection layer 122 of the light guide structure 220 and penetrate through the first light reflection layer 122 to extend to the second-type semiconductor layer 116.

Figure 12:
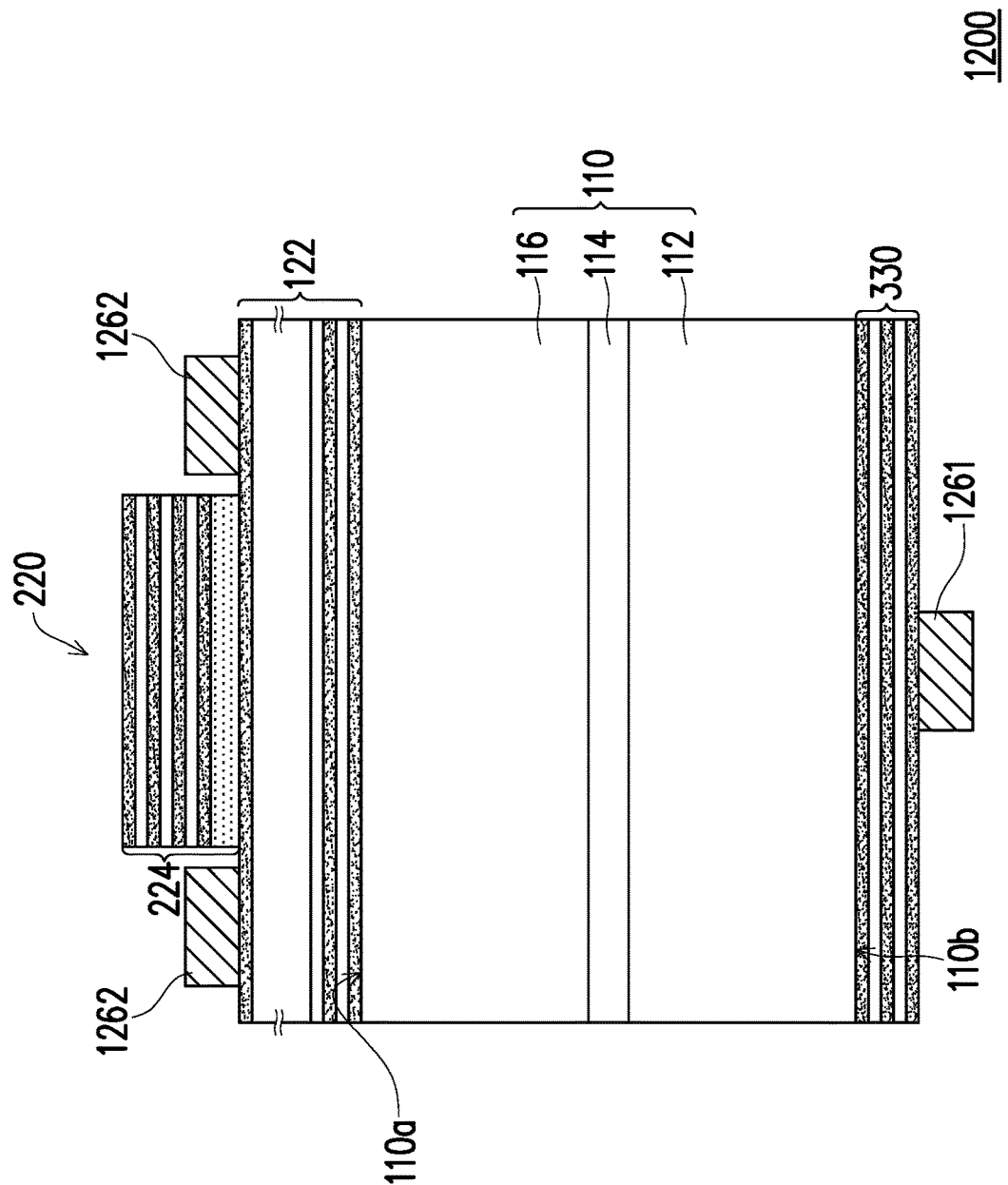

Referring to FIG. 12, compared to the light-emitting element 1100, the first light reflection layer 122 and the second light reflection layer 330 of the embodiment are doped with the P-type material or the N-type material, so that the first electrode 1261 and the second electrode 1262 may directly make ohmic contact with the second light reflection layer 330 and the first light reflection layer 122, respectively.

FIG. 13A, FIG. 14A, FIG. 15A, and FIG. 16A are partial schematic cross-sectional views of display panels according to some embodiments of the disclosure. FIG. 13B, FIG. 14B, FIG. 15B, and FIG. 16B are respectively partial enlarged view of a region A of FIG. 13A, a region B of FIG. 14A, a region C of FIG. 15A, and a region D of FIG. 16A.

Figure 13A:
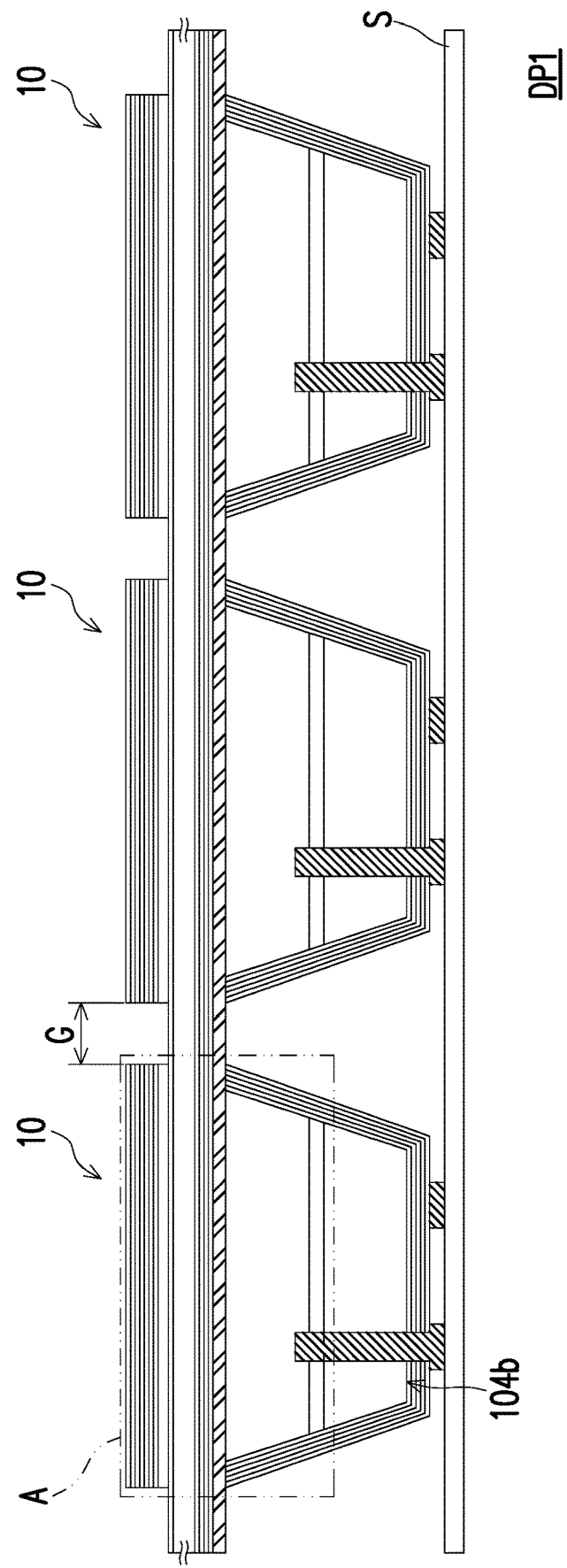
FIG. 13A, FIG. 14A, FIG. 15A, and FIG. 16A are partial schematic cross-sectional views of display panels according to some embodiments of the disclosure.
Figure 13B:
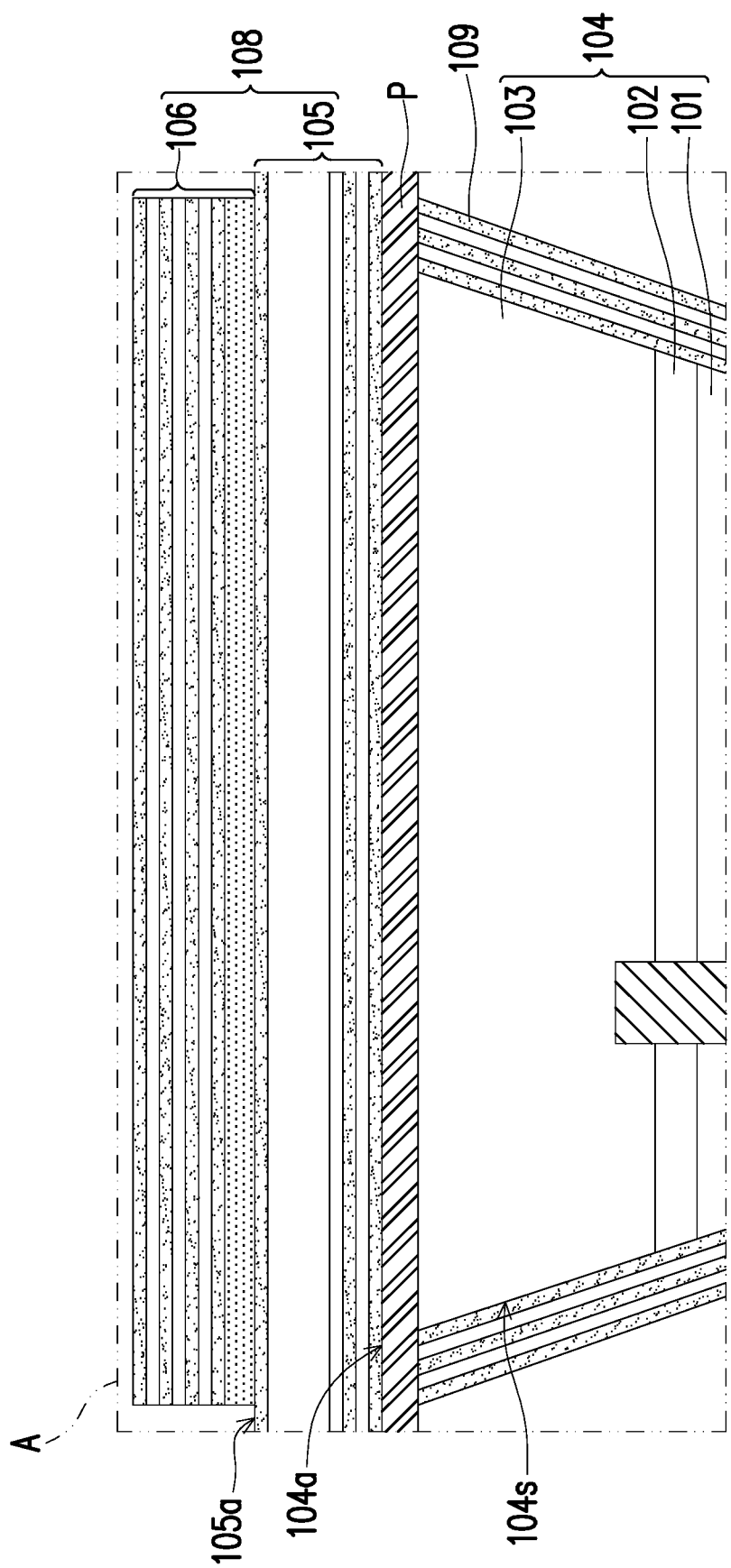
FIG. 13B, FIG. 14B, FIG. 15B, and FIG. 16B are respectively partial enlarged view of a region A of FIG. 13A, a region B of FIG. 14A, a region C of FIG. 15A, and a region D of FIG. 16A.

Referring to FIG. 13A and FIG. 13B, in the embodiment, a display panel DP1 includes a substrate S and a plurality of light-emitting elements 10, where the plurality of light-emitting elements 10 are arranged on the substrate S. It should be noted that although only three light-emitting elements 10 are shown in FIG. 13A, the disclosure does not limit the number of the light-emitting elements 10, and the light-emitting elements 10 may be arranged on the substrate S in an array. The substrate S is, for example, a backplane circuit, but the disclosure is not limited thereto.

In the embodiment, the plurality of light-emitting elements 10 have different color light and are electrically connected to the substrate S. For example, the plurality of light-emitting elements 10 respectively have a first color light, a second color light, and a third color light. In here, the disclosure does not limit light colors of the first color light, the second color light, and the third color light. Further, each light-emitting element 10 includes an epitaxial structure 104 and a light guide structure 108, where the epitaxial structure 104 has a first surface 104a and a second surface 104b opposite to each other, and the light guide structure 108 is disposed on the first surface 104a of the epitaxial structure 104, where the epitaxial structure 104 may include a first-type semiconductor layer 101, an active layer 102, and a second-type semiconductor layer 103 stacked in sequence, and the light guide structure 108 includes a first light reflection layer 105 and a filter layer 106. The first light reflection layer 105 completely covers the first surface 104a, and the filter layer 106 covers an upper surface 105a of the first light reflection layer 105. Accordingly, in the light-emitting element 10 of the embodiment, the equivalent refractivity of the overall structure is adjusted through a design of the first light reflection layer 105 and the filter layer 106 in the light guide structure 108, so that the light guide structure 108 only allows photons of a specific wavelength to pass through in each wavelength range. Namely, only light of a specific wavelength may be transmitted out of the light guide structure 120. In this way, the wavelength (color) of the emitted light may be controlled within a small range, which improves the color purity of the light emitted by the light-emitting element 10, such that the display panel DP1 including the light-emitting elements 10 has better optical quality.

In some embodiments, the first light reflection layers 105 of the light-emitting elements 10 are connected to each other to form a common light reflection layer. In other words, orthographic projections of the plurality of light-emitting elements 10 on the substrate S may fall within a range of orthogonal projections of the first light reflection layers 105 on the substrate S, but the disclosure is not limited thereto.

In some embodiments, the display panel DP1 further includes a protective layer P located between the common light reflection layer and the epitaxial structures 104 of the plurality of light-emitting elements 10. In other words, an orthographic projection of the protective layer P on the substrate S may be completely overlapped with the orthographic projections of the first light reflection layers 105 on the substrate S, but the disclosure is not limited thereto.

In some embodiments, a gap G exists between any two adjacent filter layers 106, and a part of the common light reflection layer 105 is exposed to the outside by the gap G. Since the part of the common light reflection layer 105 corresponding to the gap G does not have a light transmission property, the light emitted to the gap G by each light-emitting element 10 may be reflected by the common light reflection layer and does not penetrate through the first light reflection layer 105, so as to reduce a chance of lateral light mixing occurred in case of a large viewing angle, but the disclosure is not limited thereto.

In some embodiments, each light-emitting element 10 further includes a second light reflection layer 109, wherein the second light reflection layer 109 covers the second surface 104b of the epitaxial structure 104 and the side surface 104s connecting the first surface 104a and the second surface 104b, but the disclosure is not limited thereto.

In some embodiments, the light guide structure 108 extends beyond the side surface 104s of the epitaxial structure 104, but the disclosure is not limited thereto.

In some embodiments, the multiple electrodes of each light-emitting element 10 are arranged on the substrate S in a horizontal manner, but the disclosure is not limited thereto.

It should be noted that the disclosure is not limited to the various types of light-emitting elements and display panels of the above-mentioned embodiments, and the configurations and components of the above various types of light-emitting elements may be combined according to actual design requirements. In addition, the various types of light-emitting elements may also be designed in the display panel according to actual design requirements, and as long as the epitaxial structure of the light-emitting element of the display panel is designed with a light guide structure including a first light reflection layer and a filter layer, it is considered to be within a protection scope of the disclosure.

Figure 14A:
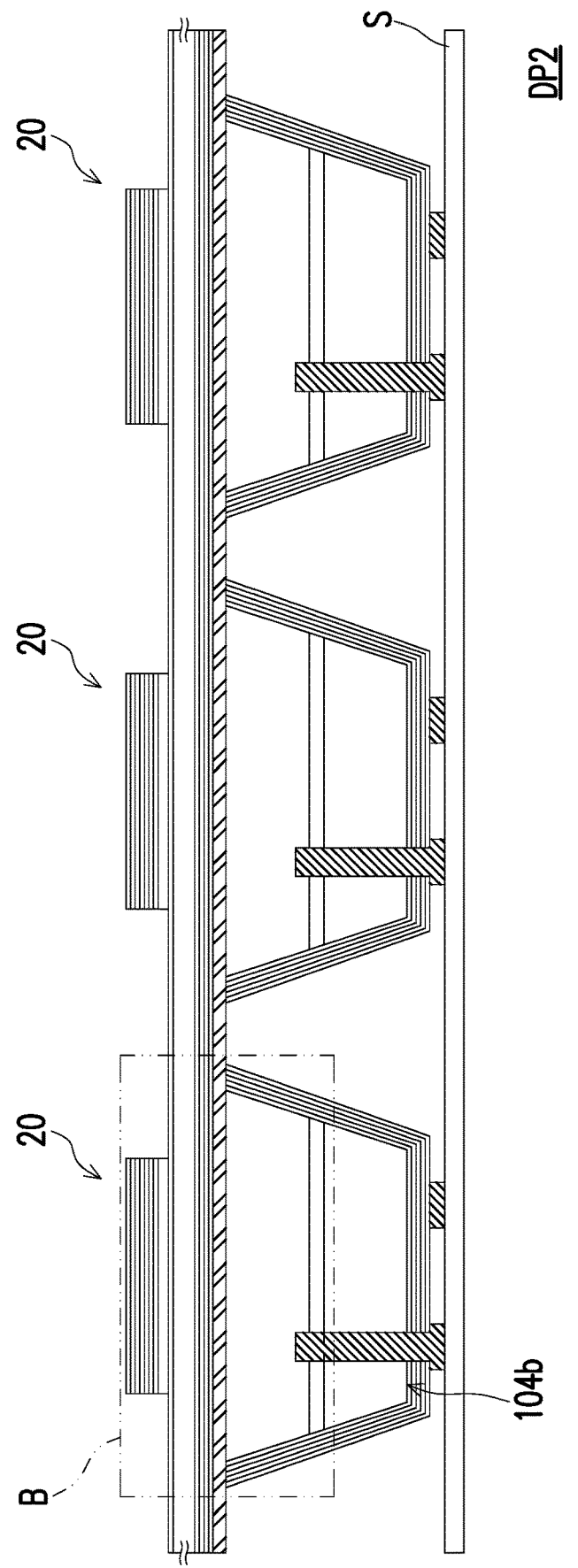
Figure 14B:
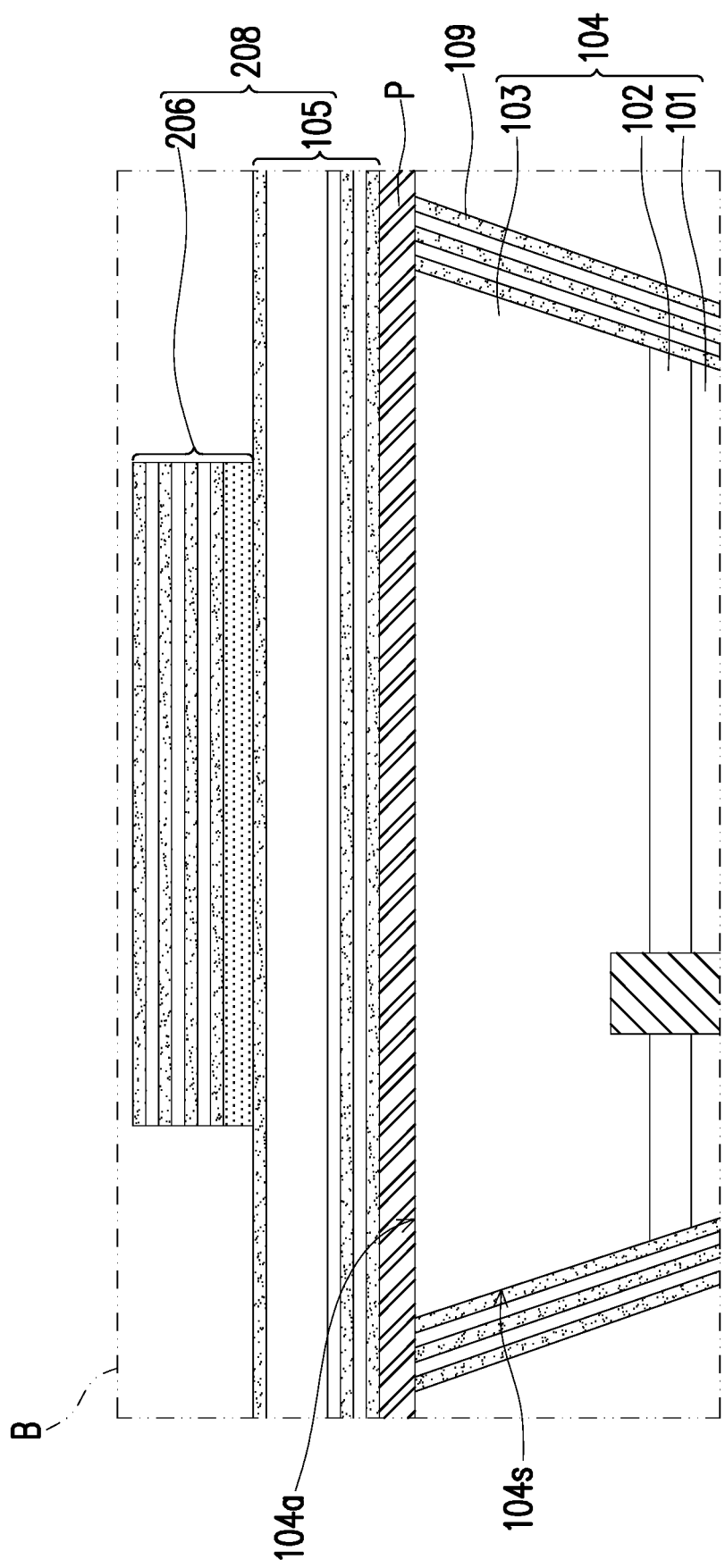

Referring to FIG. 14A and FIG. 14B, compared to the display panel DP1, an area of an orthogonal projection of a filter layer 206 of a light guide structure 208 of a light-emitting element 20 of a display panel DP2 of the embodiment on the substrate S is less than or equal to an area of an orthographic projection of the corresponding epitaxial structure 104 on the substrate S. In other words, the filter layer 206 of the light guide structure 208 is retracted into the corresponding epitaxial structure 104, but the disclosure is not limited thereto.

Figure 15A:
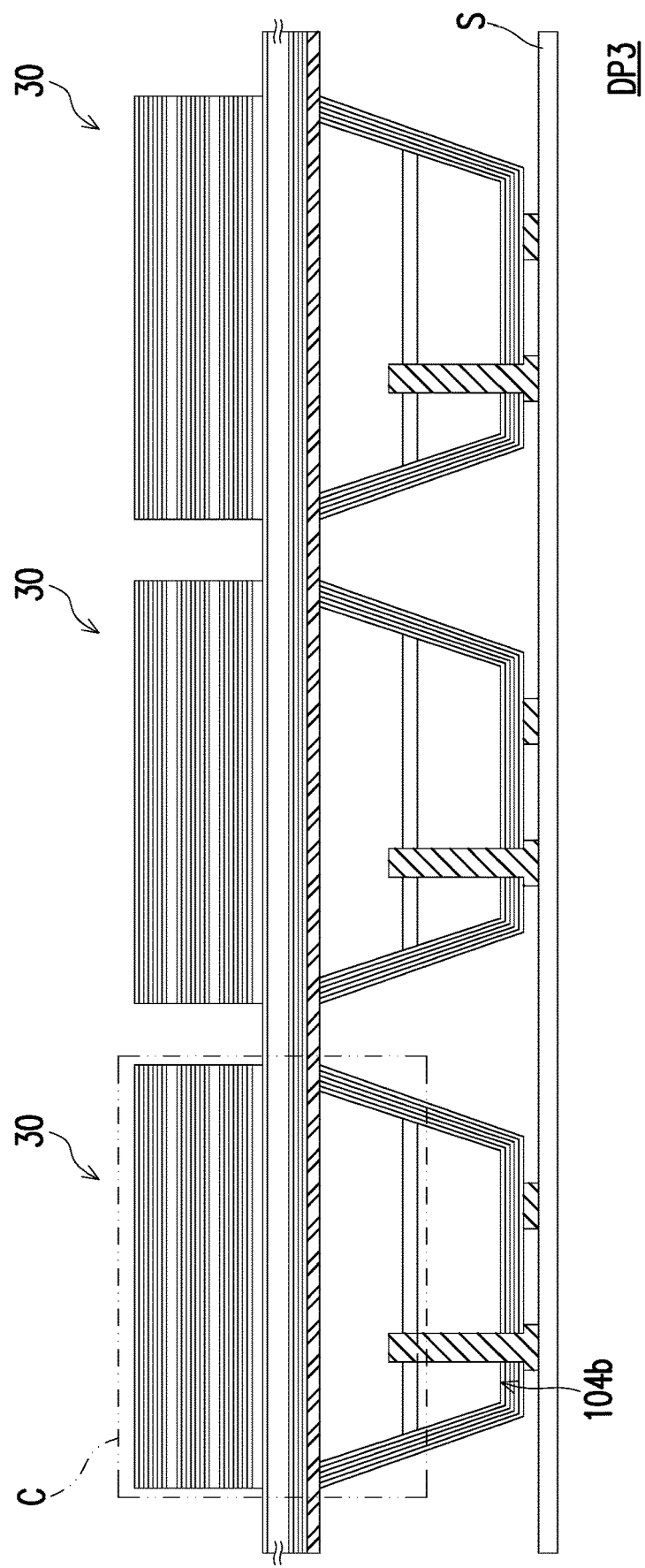
Figure 15B:
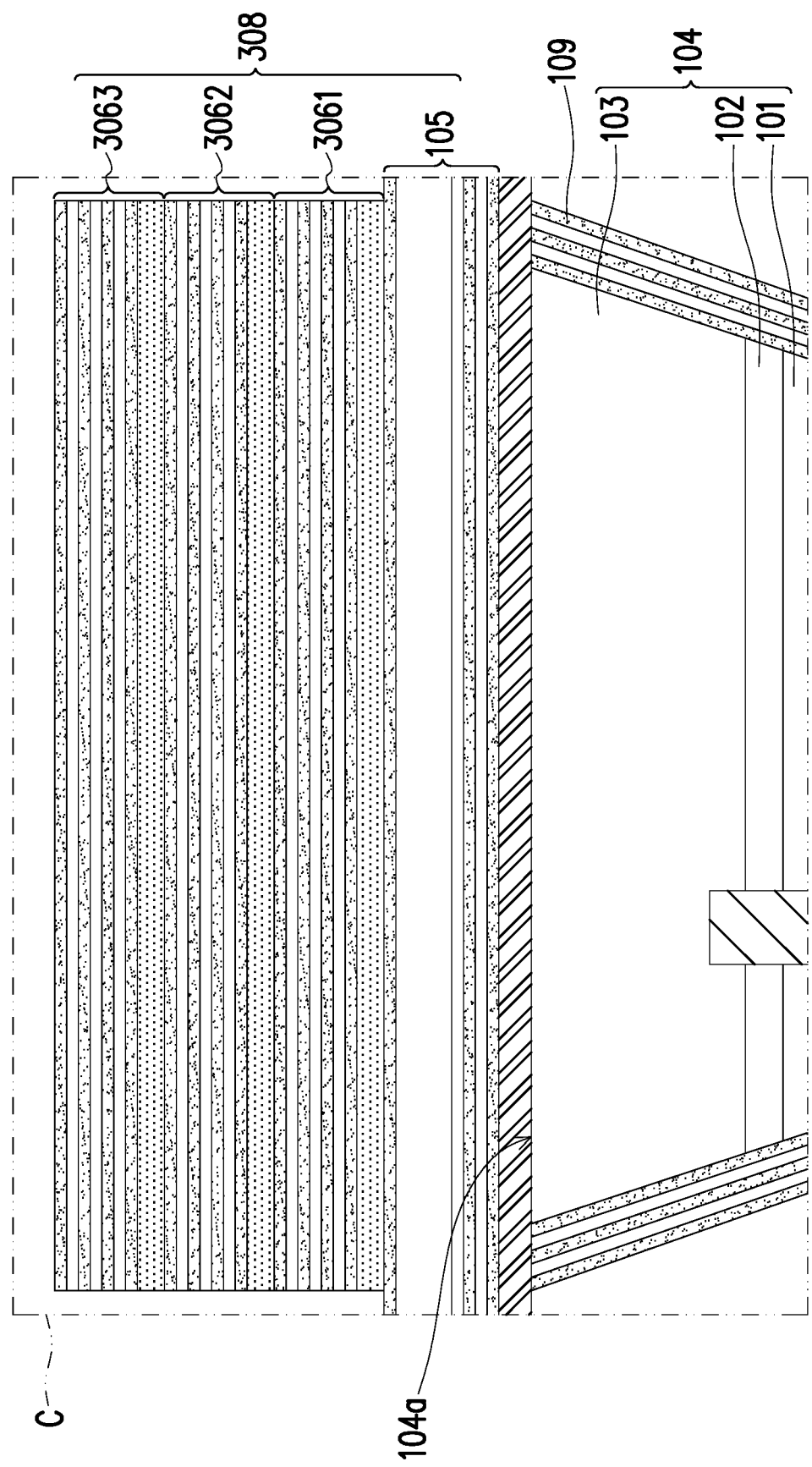

Referring to FIG. 15A and FIG. 15B, compared to the display panel DP1, a filter layer of a light guide structure 308 of a light-emitting element 30 of a display panel DP3 of the embodiment includes a first filter layer 3061 allowing the first color light to pass through, a second filter layer 3062 allowing the second color light to pass through, and a third filter layer 3063 allowing the third color light to pass through, the first filter layer 3061, the second filter layer 3062, and the third filter layer 3063 are sequentially stacked on the first light reflection layer 105 to allow a plurality of different color light wavelengths to pass through at the same time. Taking application of a display as an example, the first filter layer 3061, the second filter layer 3062, and the third filter layer 3063 may respectively correspond to light with wavelengths of red, blue, and green. In this way, all of the filter layers may be altogether fabricated on the display panel DP3 to avoid a trouble of setting filter layers of corresponding wavelengths according to the color light of each epitaxial structure 104.

Figure 16A:
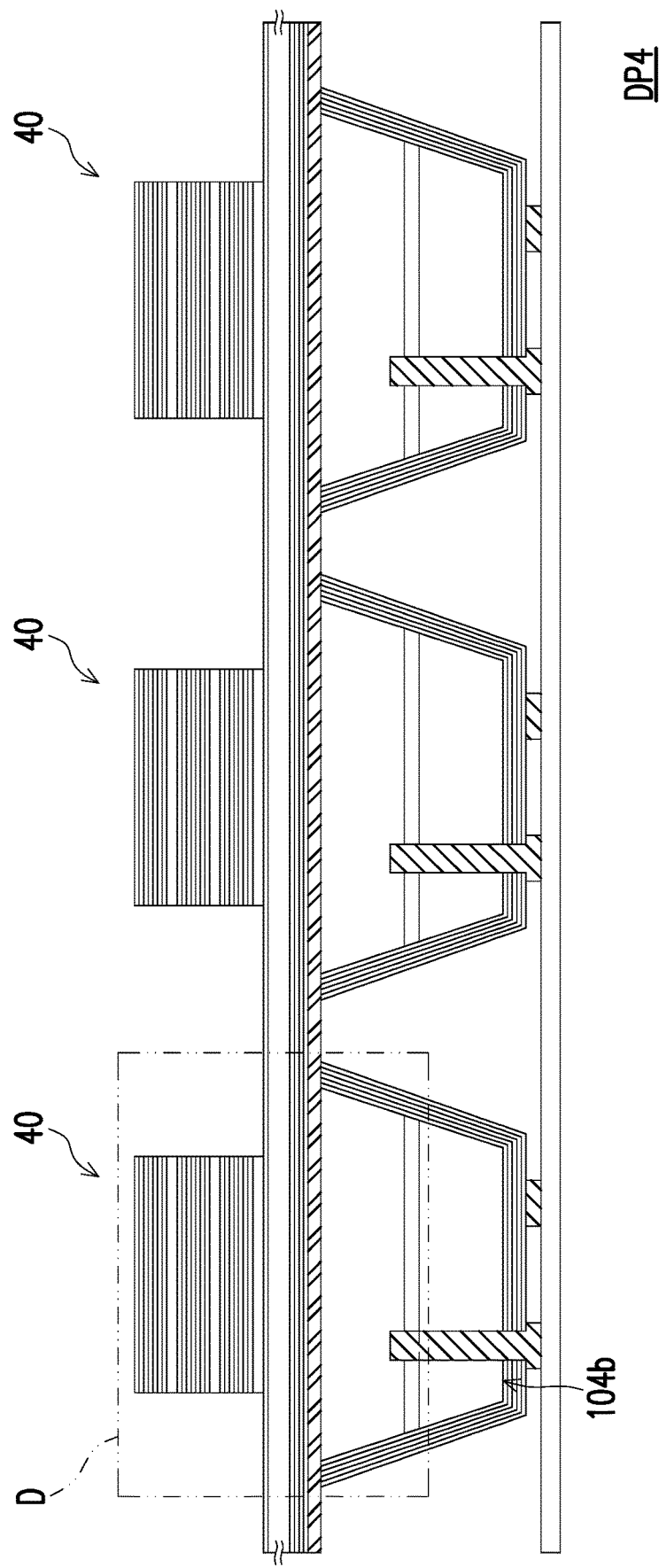
Figure 16B:
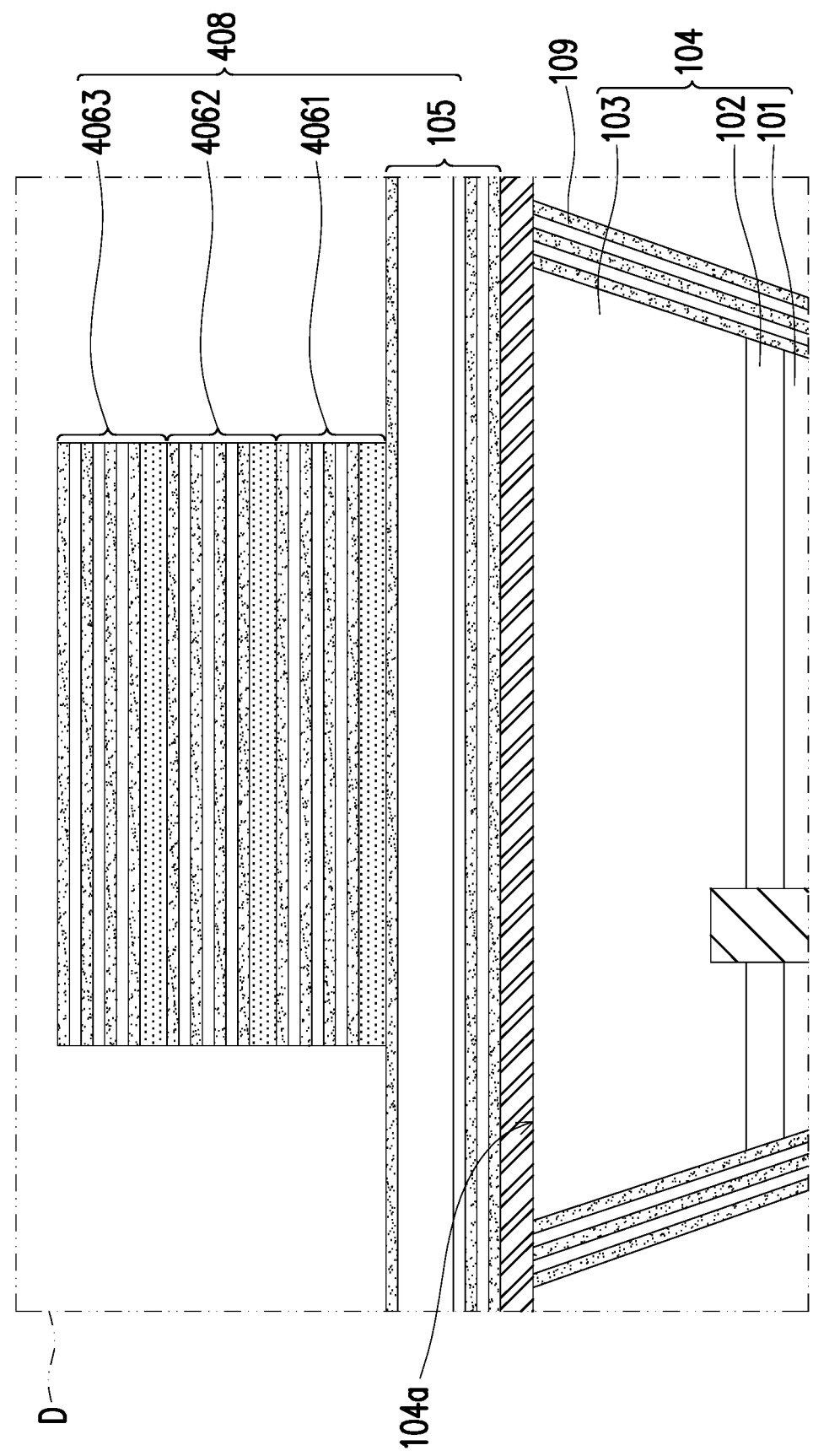

Referring to FIG. 16A and FIG. 16B, compared to the display panel DP3, an area of an orthogonal projection of filter layers (a first filter layer 4061, a second filter layer 4062, and a third filter layer 4063) of a light guide structure 408 of a light-emitting element 40 of a display panel DP4 of the embodiment on the substrate S is less than or equal to an area of an orthographic projection of the corresponding epitaxial structure 104 on the substrate S, but the disclosure is not limited thereto.

In summary, in the light-emitting element of the disclosure, through combination of the first light reflection layer and the filter layer, a forbidden band and a constructive interference section are respectively formed on a light-emitting surface of the epitaxial structure, and only light with a wavelength within such section is allowed to pass through. In this way, the wavelength (color) of the emitted light may be controlled within a small range, thereby improving the color purity of the light emitted by the light-emitting elements, so that the display panel including the light-emitting elements has better optical quality.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A light-emitting element, comprising:
   an epitaxial structure, having a first surface and a second surface opposite to each other, wherein the epitaxial structure comprises an active layer; and
   a light guide structure, disposed on the first surface of the epitaxial structure, wherein the light guide structure comprises a first light reflection layer and a filter layer covering an upper surface of the first light reflection layer, and the first light reflection layer at least partially covers the first surface,
   wherein the first light reflection layer forms a forbidden band that shields the light from the active layer, and a constructive interference section, corresponding to a specific transmission spectrum within parts of the active layer and allowing light from the active layer to pass through, is formed on the upper surface covered by the filter layer, and the filter layer retracts within the first light reflection layer, and the upper surface of the first light reflection layer comprises a first region covered by the filter layer and a second region exposed outside the filter layer.

2. The light-emitting element as claimed in claim 1, wherein the filter layer partially covers the upper surface of the first light reflection layer.

3. The light-emitting element as claimed in claim 2, wherein a ratio of an area of the first region to an area of the upper surface is greater than or equal to 20%.

4. The light-emitting element as claimed in claim 2, further comprising at least one electrode electrically connected to the epitaxial structure, wherein the at least one electrode is adjacent to the filter layer and disposed on the upper surface.

5. The light-emitting element as claimed in claim 1, further comprising a second light reflection layer covering the second surface.

6. The light-emitting element as claimed in claim 5, wherein the epitaxial structure further has a side surface connecting the first surface and the second surface, and the second light reflection layer further covers the side surface.

7. The light-emitting element as claimed in claim 6, wherein the first light reflection layer extends beyond the side surface of the epitaxial structure, and the second light reflection layer is connected to the first light reflection layer.

8. The light-emitting element as claimed in claim 1, further comprising a first protective layer, wherein the light guide structure is located between the first protective layer and the epitaxial structure, or the first protective layer is located between the first light reflection layer and the epitaxial structure.

9. The light-emitting element as claimed in claim 8, further comprising a second protective layer disposed at both sides of the filter layer and covering the first light reflection layer.

10. The light-emitting element as claimed in claim 1, further comprising a plurality of electrodes electrically connected to the epitaxial structure, wherein the plurality of electrodes are disposed at the second surface of the epitaxial structure, or the plurality of electrodes are respectively disposed at the first surface and the second surface of the epitaxial structure.

11. The light-emitting element as claimed in claim 1, wherein a thickness of the filter layer is positively correlated with an equivalent refractivity of the light guide structure.

12. The light-emitting element as claimed in claim 1, wherein the first light reflection layer is doped with a P-type material or an N-type material.

13. The light-emitting element as claimed in claim 1, wherein the first light reflection layer and the filter layer comprise an aluminum material, and an aluminum content of the first light reflection layer is less than an aluminum content of the filter layer.

14. A display panel, comprising:
 a substrate; and
 a plurality of light-emitting elements, arranged on the substrate, wherein the light-emitting elements have different color light, and are electrically connected to the substrate, and each of the light-emitting elements comprises:
  an epitaxial structure, having a first surface and a second surface opposite to each other, and comprising an active layer;
  a light guide structure, disposed on the first surface of the epitaxial structure, and comprising a first light reflection layer and a filter layer covering an upper surface of the first light reflection layer, wherein the first light reflection layer at least partially covers the first surface,
  wherein the first light reflection layer forms a forbidden band that shields the light from the active layer, and a constructive interference section, corresponding to a specific transmission spectrum within parts of the active layer and allowing light from the active layer to pass through, is formed on the upper surface covered by the filter layer, and the filter layer retracts within the first light reflection layer, and the upper surface of the first light reflection layer comprises a first region covered by the filter layer and a second region exposed outside the filter layer.

15. The display panel as claimed in claim 14, wherein an area of an orthographic projection of the filter layer of each of the light-emitting elements on the substrate is less than or equal to an area of an orthographic projection of the corresponding epitaxial structure on the substrate.

16. The display panel as claimed in claim 14, wherein the plurality of first light reflection layers of the plurality of light-emitting elements are connected to each other.

17. The display panel as claimed in claim 16, further comprising a protective layer, wherein the protective layer is located between the plurality of first light reflection layers and the plurality of epitaxial structures.

18. The display panel as claimed in claim 16, wherein a gap exists between any two adjacent filter layers, and the plurality of first light reflection layers are exposed to the outside by the gap.

19. The display panel as claimed in claim 14, wherein the plurality of light-emitting elements respectively have first color light, second color light, and third color light, each of the filter layers of the light-emitting elements comprises a first filter layer allowing the first color light to pass through, a second filter layer allowing the second color light to pass through, and a third filter layer allowing the third color light to pass through, and the first filter layer, the second filter layer and the third filter layer are sequentially stacked on the first light reflection layer.

20. The display panel as claimed in claim 14, wherein the epitaxial structure further has a side surface connecting the first surface and the second surface, each of the light-emitting elements further comprises a second light reflection layer, and the second light reflection layer covers the second surface and the side surface.

* * * * *